United States Patent
Jeon et al.

(10) Patent No.: US 12,300,589 B2
(45) Date of Patent: May 13, 2025

(54) SEMICONDUCTOR PACKAGE

(71) Applicant: Samsung Electronics Co., Ltd., Suwon-si (KR)

(72) Inventors: Gwangjae Jeon, Hwaseong-si (KR); Jung-Ho Park, Cheonan-si (KR); Seokhyun Lee, Hwaseong-si (KR); Yaejung Yoon, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 429 days.

(21) Appl. No.: 17/405,603

(22) Filed: Aug. 18, 2021

(65) Prior Publication Data

US 2022/0077041 A1    Mar. 10, 2022

(30) Foreign Application Priority Data

Sep. 9, 2020    (KR) .................. 10-2020-0115240

(51) Int. Cl.
*H01L 23/498*    (2006.01)
*H01L 23/00*    (2006.01)
*H01L 23/31*    (2006.01)

(52) U.S. Cl.
CPC .... *H01L 23/49816* (2013.01); *H01L 23/3128* (2013.01); *H01L 23/49822* (2013.01);
(Continued)

(58) Field of Classification Search
None
See application file for complete search history.

(56) References Cited

U.S. PATENT DOCUMENTS 9,000,586 B2    4/2015    Do et al.
9,922,924 B1    3/2018    Shih
(Continued)

FOREIGN PATENT DOCUMENTS

CN    106233460 A    * 12/2016    ............ H01L 21/56
CN    108074822 A      5/2018
(Continued)

OTHER PUBLICATIONS

Michael, M. et al. "Packaging Assembly Reliability Using Polymer Flip Chip (PFC) Process of Smart Card/IC Module." China Integrated Circuit, Issue No. 80 (2006).
(Continued)

*Primary Examiner* — Telly D Green
(74) *Attorney, Agent, or Firm* — Harness, Dickey & Pierce, P.L.C.

(57) ABSTRACT

Disclosed are semiconductor packages and methods of fabricating the same. The semiconductor package comprises a first redistribution substrate and a first semiconductor device on the first redistribution substrate. The first redistribution substrate includes a first dielectric layer that includes a first hole, an under-bump that includes a first bump part in the first hole and a second bump part that protrudes from the first bump part onto the first dielectric layer, an external connection terminal on a bottom surface of the first dielectric layer and connected to the under-bump through the first hole, a wetting layer between the external connection terminal and the under-bump, and a first barrier/seed layer between the under-bump and the first dielectric layer and between the under-bump and the wetting layer.

16 Claims, 19 Drawing Sheets

(52) U.S. Cl.
CPC ........ *H01L 23/49838* (2013.01); *H01L 24/16* (2013.01); *H01L 24/32* (2013.01); *H01L 24/73* (2013.01); *H01L 2224/16227* (2013.01); *H01L 2224/32225* (2013.01); *H01L 2224/73204* (2013.01)

(56) References Cited

U.S. PATENT DOCUMENTS

| | | | |
|---|---|---|---|
| 10,014,260 B2* | 7/2018 | Tsai | H01L 23/5386 |
| 10,204,889 B2 | 2/2019 | Lin et al. | |
| 10,403,579 B2 | 9/2019 | Lee et al. | |
| 10,483,211 B2* | 11/2019 | Lin | H01L 28/20 |
| 10,573,587 B2 | 2/2020 | Kuo et al. | |
| 10,700,029 B2* | 6/2020 | Lu | H01L 23/3128 |
| 10,950,539 B2 | 3/2021 | Kim et al. | |
| 11,024,605 B2* | 6/2021 | Chen | H01L 23/3128 |
| 11,075,149 B2 | 7/2021 | Lee | |
| 11,502,062 B2* | 11/2022 | Chen | H01L 24/20 |
| 2007/0015351 A1* | 1/2007 | Tomimori | H01L 24/03 |
| | | | 257/E23.021 |
| 2007/0069346 A1* | 3/2007 | Lin | H01L 24/11 |
| | | | 257/673 |
| 2012/0129335 A1* | 5/2012 | Ikumo | H01L 23/3192 |
| | | | 257/E21.159 |
| 2013/0075905 A1 | 3/2013 | Choi et al. | |
| 2015/0187715 A1* | 7/2015 | Hart | H01L 24/11 |
| | | | 257/738 |
| 2015/0206846 A1* | 7/2015 | Lo | H01L 24/03 |
| | | | 257/737 |
| 2017/0084596 A1* | 3/2017 | Scanlan | H01L 23/3675 |
| 2017/0154850 A1* | 6/2017 | Kao | H01L 24/00 |
| 2017/0243826 A1* | 8/2017 | Lin | H01L 21/4853 |
| 2017/0316989 A1* | 11/2017 | Tsai | G01R 31/28 |
| 2018/0130749 A1* | 5/2018 | Tsai | H01L 21/4853 |
| 2018/0330966 A1* | 11/2018 | Scanlan | H01L 24/19 |
| 2019/0053373 A1* | 2/2019 | Lu | H05K 1/111 |
| 2019/0103353 A1* | 4/2019 | Liu | H01L 25/0655 |
| 2019/0122949 A1* | 4/2019 | Lee | H01L 23/498 |
| 2019/0371732 A1* | 12/2019 | Lee | H01L 23/49816 |
| 2020/0066639 A1* | 2/2020 | Lee | H01L 25/50 |
| 2020/0135675 A1* | 4/2020 | Lu | H01L 23/49816 |
| 2020/0194362 A1* | 6/2020 | Park | H01L 24/08 |
| 2020/0381396 A1* | 12/2020 | Chen | H01L 23/5226 |
| 2021/0066149 A1 | 3/2021 | Park et al. | |
| 2021/0288002 A1* | 9/2021 | Sung | H01L 23/562 |
| 2021/0288030 A1* | 9/2021 | Chen | H01L 21/31053 |
| 2021/0335729 A1* | 10/2021 | Lu | H01L 21/6835 |
| 2022/0020714 A1 | 1/2022 | Choi et al. | |

FOREIGN PATENT DOCUMENTS

| | | | |
|---|---|---|---|
| CN | 110896062 A | | 3/2020 |
| CN | 111584455 A | | 8/2020 |
| JP | 2008252011 A | * | 10/2008 |
| KR | 20120005383 A | * | 1/2012 |
| KR | 10-1787840 B1 | | 10/2017 |
| KR | 20200058129 A | * | 5/2020 |
| KR | 10-2021-0026546 A | | 3/2021 |
| KR | 10-2022-0009193 A | | 1/2022 |

OTHER PUBLICATIONS

Wang, G. et al. "Chip-packaging interaction: a critical concern for Cu/low k packaging." Microelectronics Reliability 45 (2005): pp. 1079-1093.

* cited by examiner

SEMICONDUCTOR PACKAGE

CROSS-REFERENCE TO RELATED APPLICATION

This U.S. nonprovisional application claims priority under 35 U.S.C § 119 to Korean Patent Application No. 10-2020-0115240 filed on Sep. 9, 2020 in the Korean Intellectual Property Office, the disclosure of which is hereby incorporated by reference in its entirety.

BACKGROUND

The present inventive concepts relate to a semiconductor package and a method of fabricating the same.

A semiconductor package is provided to implement an integrated circuit chip to qualify for use in electronic products. A semiconductor package is typically configured such that a semiconductor chip is mounted on a printed circuit board (PCB) and bonding wires or bumps are used to electrically connect the semiconductor chip to the printed circuit board. With the development of electronic industry, many studies have been conducted to improve reliability and/or durability of semiconductor packages.

SUMMARY

Some example embodiments of the present inventive concepts provide a semiconductor package with increased reliability.

Some example embodiments of the present inventive concepts provide a method of fabricating a semiconductor package, which method is capable of increasing a yield.

An object of the present inventive concepts is not limited to the mentioned above, and other objects which have not been mentioned above will be clearly understood to those skilled in the art from the following description.

According to some example embodiments of the present inventive concepts, a semiconductor package may comprise: a first redistribution substrate; and a first semiconductor device on the first redistribution substrate. The first redistribution substrate may include: a first dielectric layer that includes a first hole; an under-bump that includes a first bump part in the first hole and a second bump part that protrudes from the first bump part onto the first dielectric layer; an external connection terminal on a bottom surface of the first dielectric layer and connected to the under-bump through the first hole; a wetting layer between the external connection terminal and the under-bump; and a first barrier/seed layer between the under-bump and the first dielectric layer and between the under-bump and the wetting layer.

According to some example embodiments of the present inventive concepts, a semiconductor package may comprise: a first redistribution substrate; and a first semiconductor device on the first redistribution substrate. The first redistribution substrate may include: a first dielectric layer that includes a first hole; an under-bump that includes a first bump part in the first hole and a second bump part that protrudes from the first bump part onto the first dielectric layer; and an external connection terminal on a bottom surface of the first dielectric layer and connected to the under-bump through the first hole. An inner sidewall of the first hole may make a first angle with the bottom surface of the first dielectric layer. The first angle may range from about 45° to about 90°.

According to some example embodiments of the present inventive concepts, a semiconductor package may comprise: a first redistribution substrate; a first semiconductor device on the first redistribution substrate; and a mold layer that covers the first semiconductor device and the first redistribution substrate. The first redistribution substrate may include: a first dielectric layer that includes a first hole; an under-bump that includes a first bump part in the first hole and a second bump part that protrudes from the first bump part onto the first dielectric layer; an external connection terminal on a bottom surface of the first dielectric layer and connected to the under-bump through the first hole; a wetting layer between the external connection terminal and the under-bump; a first barrier/seed layer between the under-bump and the first dielectric layer and between the under-bump and the wetting layer; a second dielectric layer that covers the under-bump and the first dielectric layer; and a first redistribution pattern that penetrates the second dielectric layer and is connected to the under-bump. The external connection terminals may include: a first terminal part in the first hole; and a second terminal part that protrudes outwardly from the bottom surface of the first dielectric layer. A sidewall of the first terminal part may make a first angle with a top surface of the second terminal part. The first angle may range from about 45° to about 90°.

According to some example embodiments of the present inventive concepts, a method of fabricating a semiconductor package may comprise: forming a redistribution substrate; mounting a semiconductor device on the redistribution substrate; and bonding an external connection terminal to the redistribution substrate. The step of forming the redistribution substrate may include: sequentially stacking a release layer and an etch stop layer on a carrier substrate; coating a first dielectric layer on the etch stop layer; exposing and developing the first dielectric layer to form a first hole that exposes the etch stop layer; sequentially stacking a sacrificial pattern and a wetting layer in the first hole, the wetting layer exposing an upper portion of an inner sidewall of the first hole; forming a first barrier/seed layer and an under-bump on the wetting layer; and removing the carrier substrate, the release layer, the etch stop layer, and the sacrificial pattern to expose the wetting layer and a bottom surface of the first dielectric layer. The external connection terminal may be bonded to the wetting layer.

DETAILED DESCRIPTION OF EXAMPLE EMBODIMENTS

Some example embodiments of the present inventive concepts will now be described in detail with reference to the accompanying drawings to aid in clearly explaining the present inventive concepts.

Figure 1:
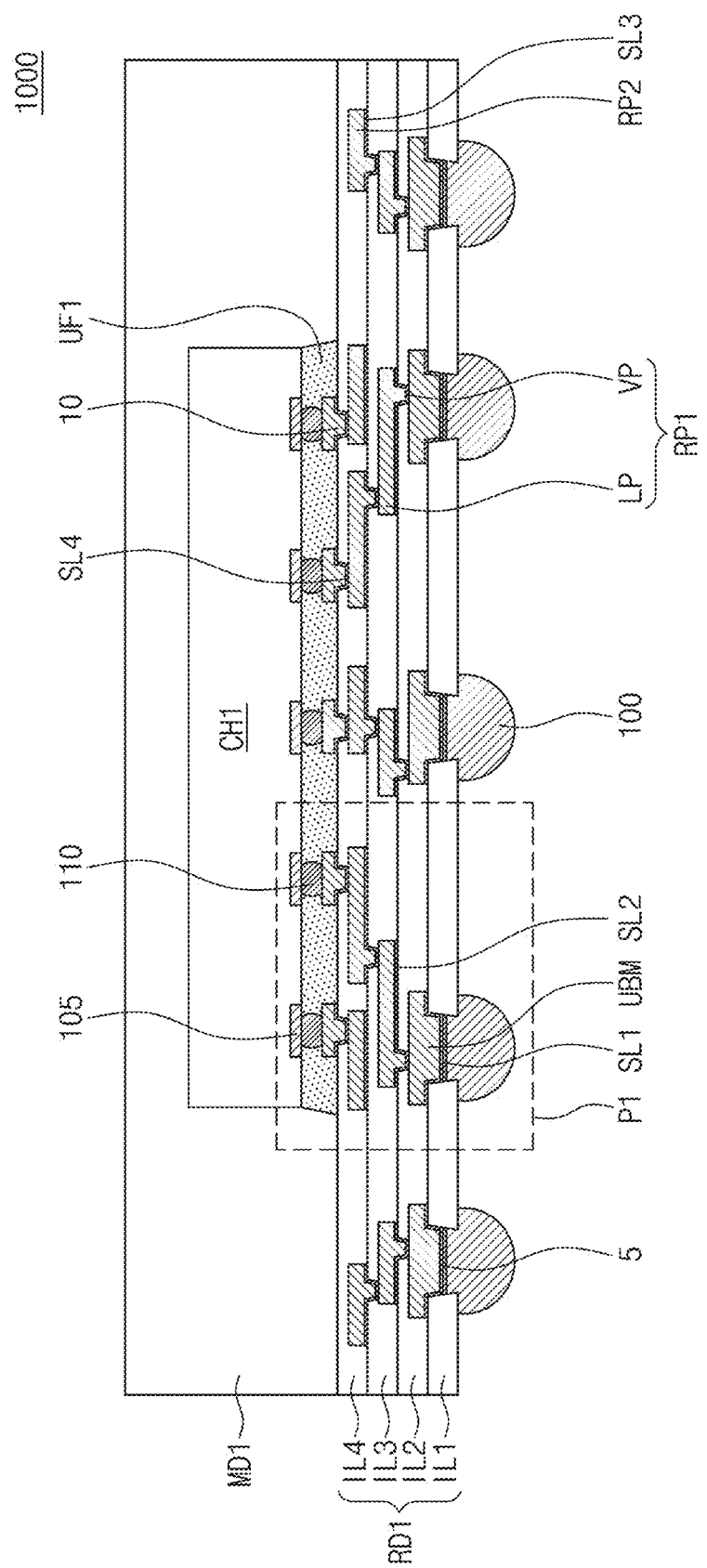
FIG. 1 illustrates a cross-sectional view showing a semiconductor package according to some example embodiments of the present inventive concepts.
Figure 2:
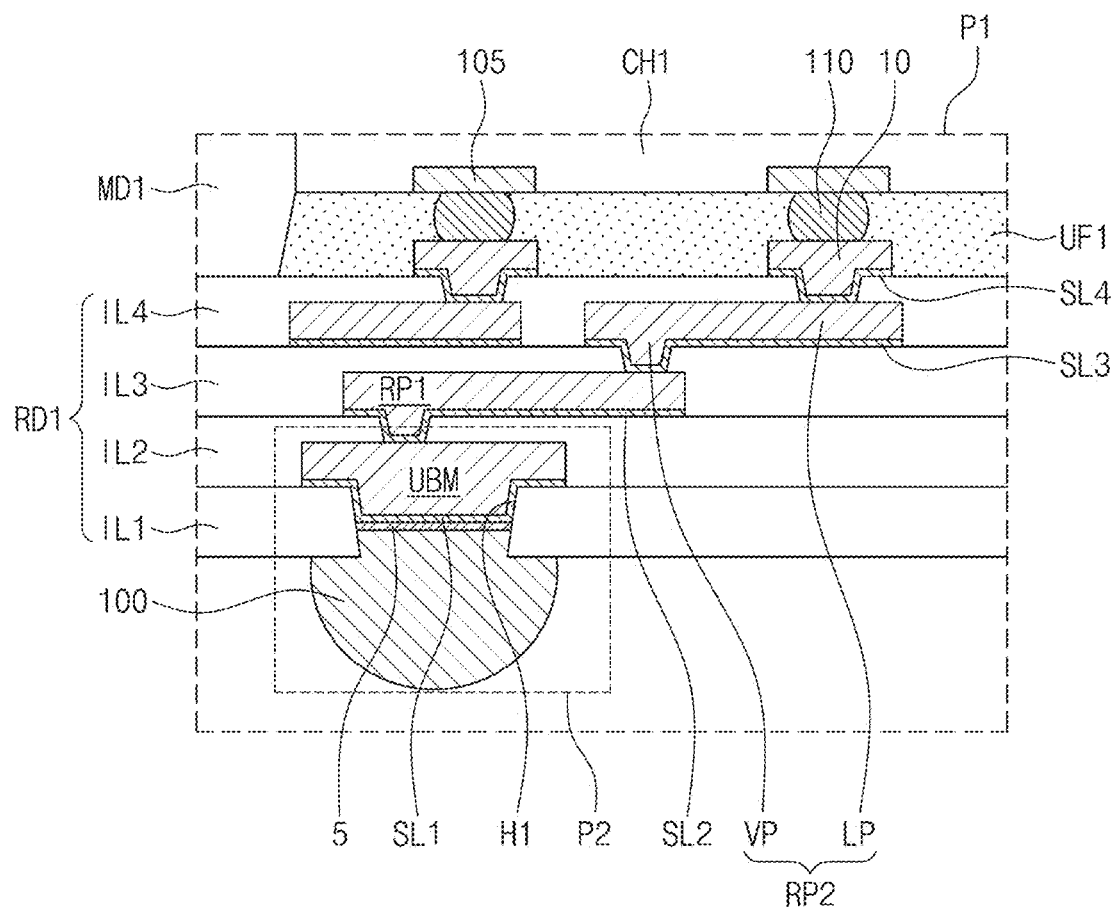
FIG. 2 illustrates an enlarged view showing section P1 of FIG. 1 according to some example embodiments of the present inventive concepts.
Figure 3A:
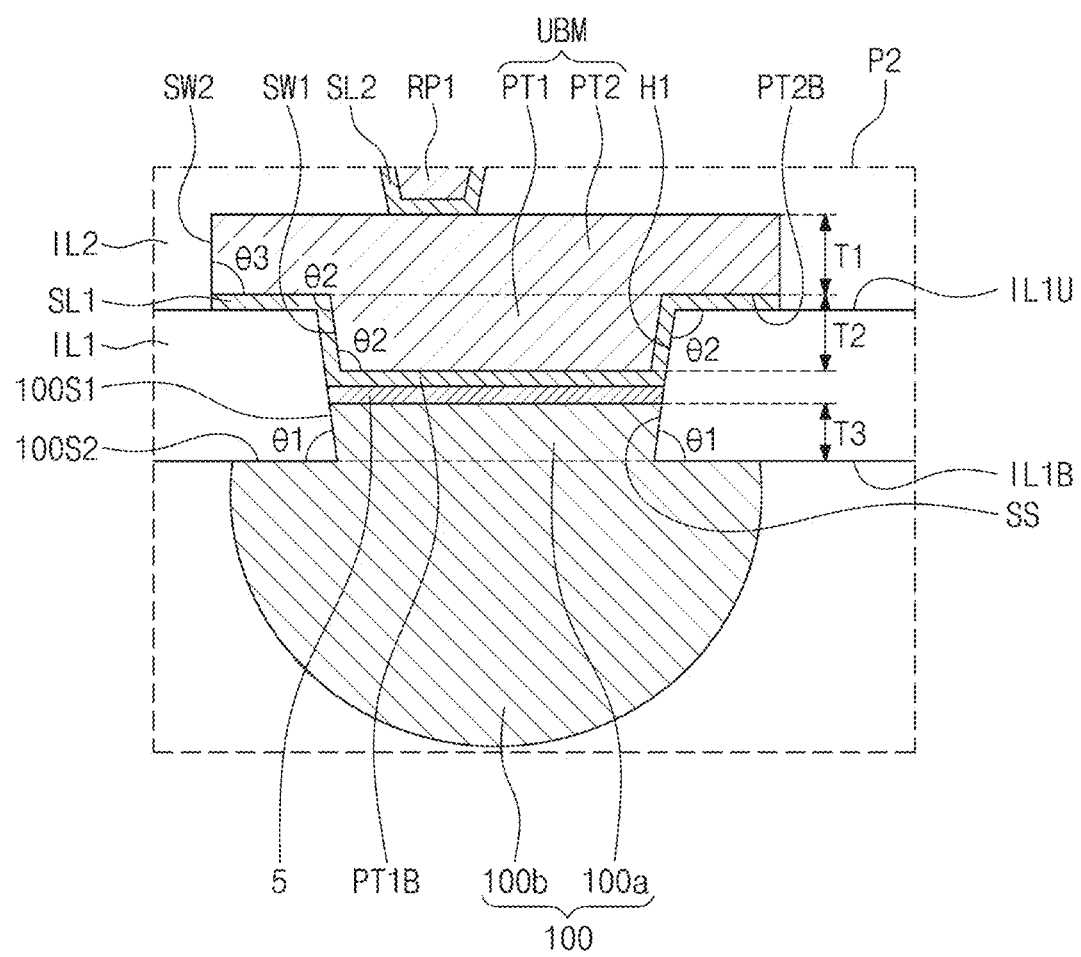
FIGS. 3A to 3C illustrate enlarged views showing section P2 of FIG. 2 according to some example embodiments of the present inventive concepts.
Figure 3B:
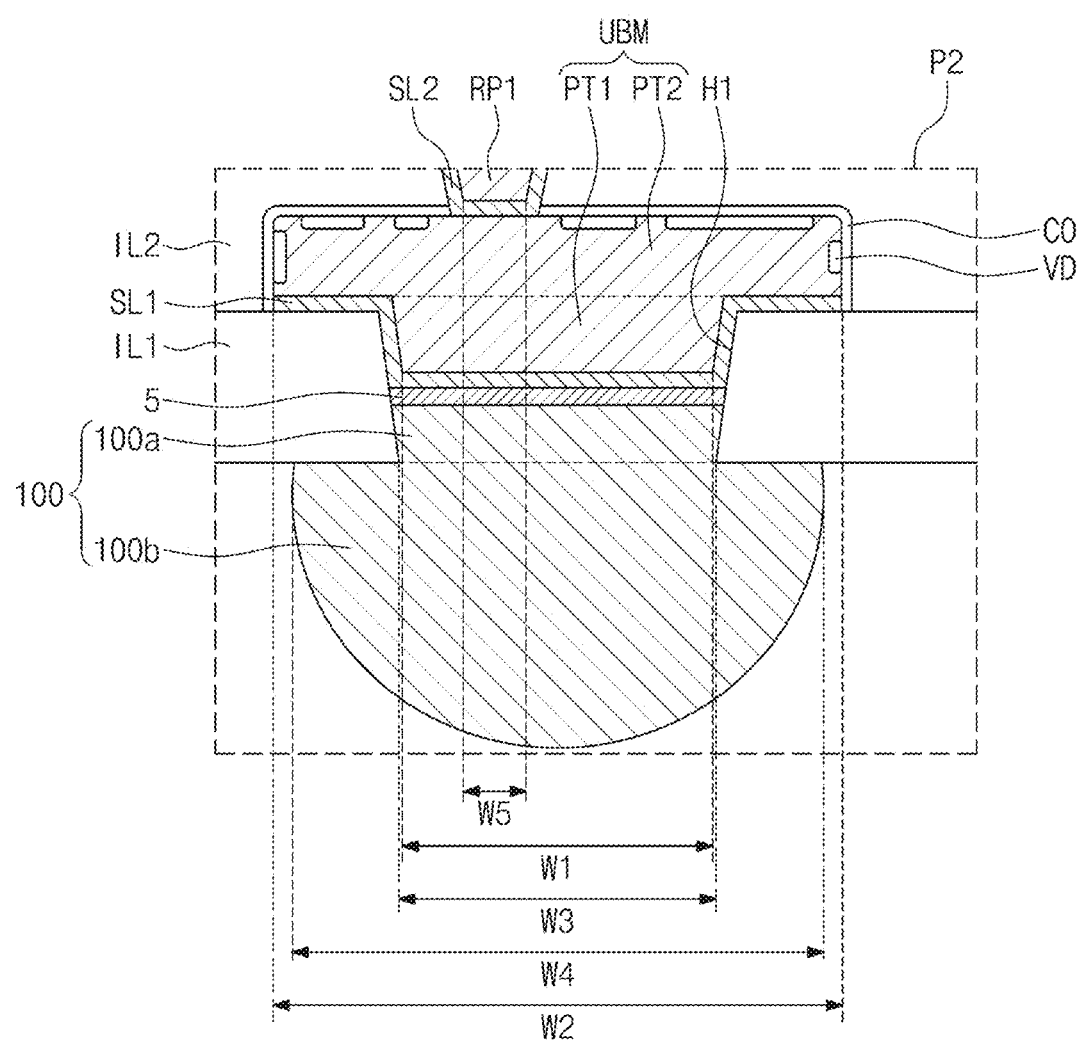
Figure 3C:
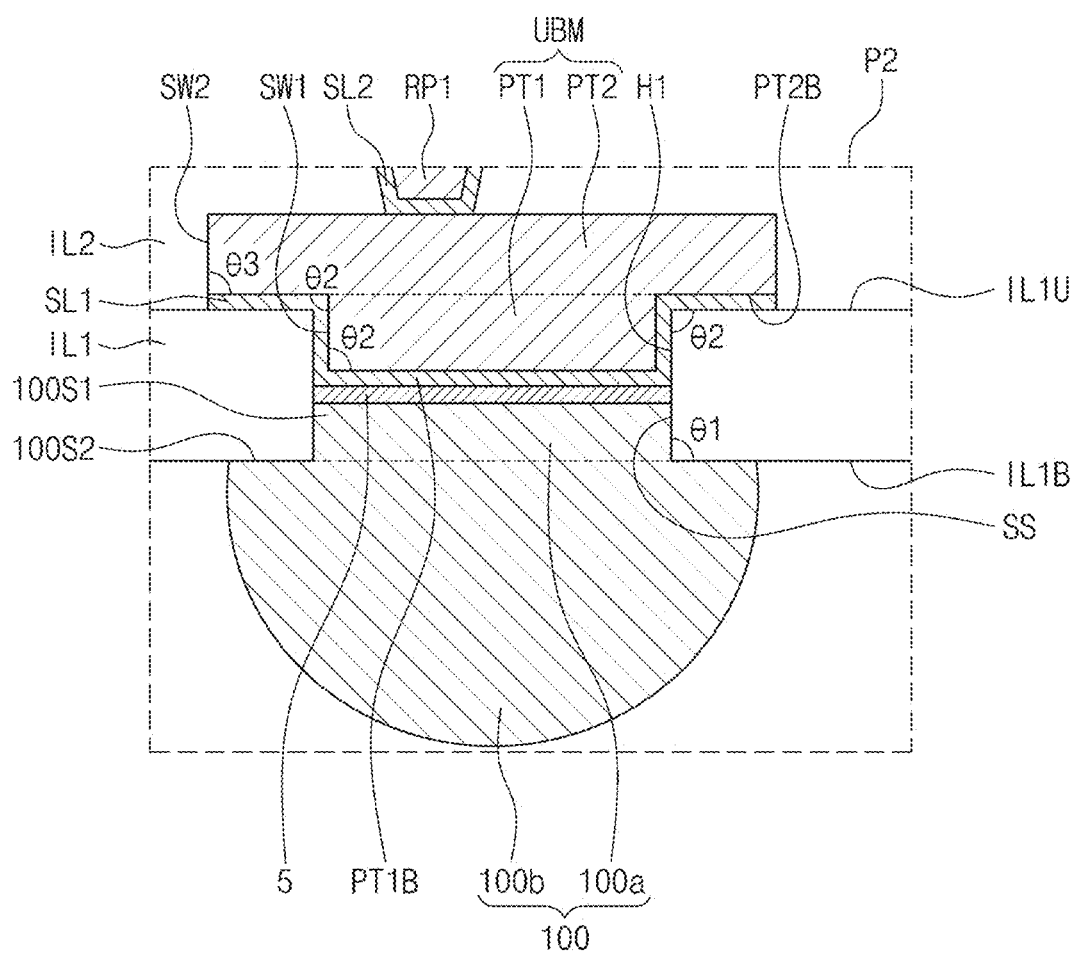
Figure 4:
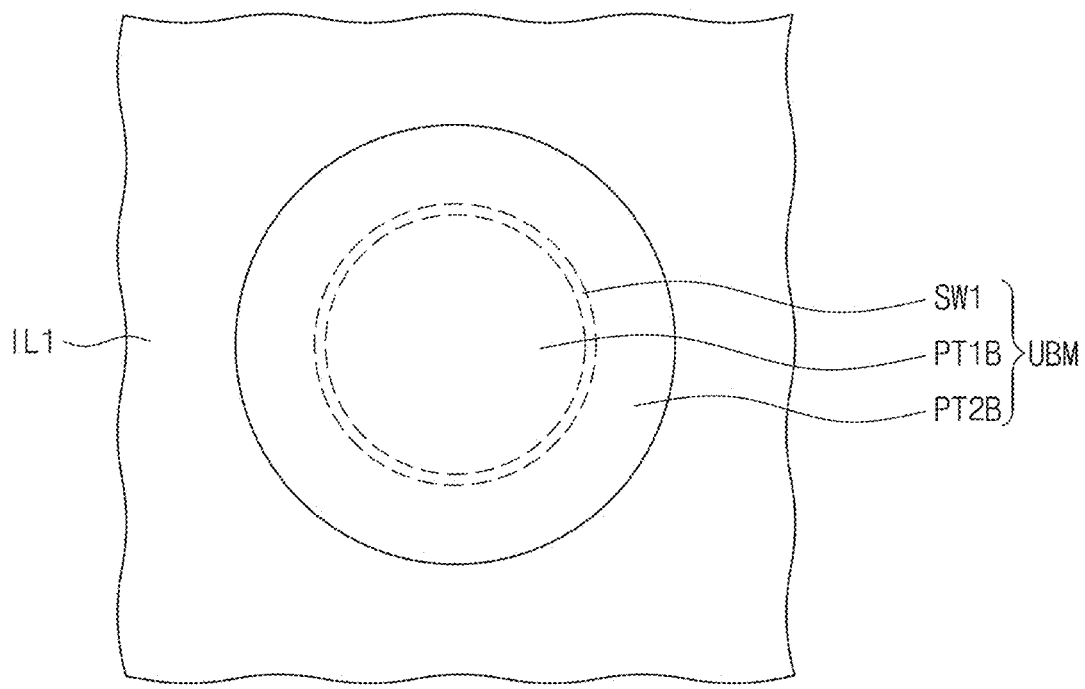
FIG. 4 illustrates a plan view showing an under-bump according to some example embodiments of the present inventive concepts.

FIG. 1 illustrates a cross-sectional view showing a semiconductor package according to some example embodiments of the present inventive concepts. FIG. 2 illustrates an enlarged view showing section P1 of FIG. 1 according to some example embodiments of the present inventive concepts. FIGS. 3A to 3C illustrate enlarged views showing section P2 of FIG. 2 according to some example embodiments of the present inventive concepts. FIG. 4 illustrates a plan view showing an under-bump according to some example embodiments of the present inventive concepts.

Referring to FIGS. 1 and 2, a semiconductor package 1000 according to the present example embodiments may include a first redistribution substrate RD1 and a first semiconductor device CH1 mounted on the first redistribution substrate RD1. The first semiconductor device CH1 and the first redistribution substrate RD1 may be covered with a first mold layer MD1. In this description, the term "redistribution substrate" may be called "redistribution layer" or "wiring structure."

The first redistribution substrate RD1 may include first, second, third, and fourth dielectric layers IL1, IL2, IL3, and IL4 that are sequentially stacked. The first, second, third, and fourth dielectric layers IL1, IL2, IL3, and IL4 may each include a photo-imageable dielectric (PID) layer.

Referring to FIGS. 1, 2, and 3A, the first dielectric layer IL1 may include a plurality of first holes H1. The first hole H1 may have an inclined inner sidewall SS. The inner sidewall SS of the first hole H1 may make a first angle θ1 with a bottom surface IL1B of the first dielectric layer ILL The first angle θ1 may be, for example, an acute angle. The first angle θ1 may range, for example, from about 45° to about 90°. The inner sidewall SS of the first hole H1 may make a second angle θ2 with a top surface IL1U of the first dielectric layer ILL The second angle θ2 may be, for example, an obtuse angle. The second angle θ2 may range, for example, from about 90° to about 135°.

Referring to FIG. 3A, under-bumps UBM may be correspondingly disposed in the first holes H1. The under-bumps UBM may each have a T-shaped cross-section. The under-bumps UBM may each include a first bump part PT1 that is inserted into the first hole H1 and a second bump part PT2 that protrudes onto the first dielectric layer ILL The first and second bump parts PT1 and PT2 may be integrally connected into a single piece. The first bump part PT1 may have an inclined first sidewall SW1. The first sidewall SW1 of the first bump part PT1 and a bottom surface PT2B of the second bump part PT2 may make therebetween an angle the same as the second angle θ2. The first sidewall SW1 of the first bump part PT1 and a bottom surface PT1B of the first bump part PT1 may make therebetween an angle the same as the second angle θ2.

Referring still to FIG. 3A, the bottom surface PT2B of the second bump part PT2 may make a third angle θ3 with a second sidewall SW2 of the second bump part PT2. The third angle θ3 may be greater than the first angle θ1 and less than the second angle θ2. For example, the third angle θ3 may be about 90° or right angle. As shown in FIG. 3A, the second sidewall SW2 of the second bump part PT2 may be almost perpendicular to the top surface IL1U of the first dielectric layer IL1.

In example embodiments of the present inventive concepts, as shown in FIG. 3C, the first to third angles θ1 to θ3 may each be about 90°.

Referring to FIG. 3B, the first bump part PT1 may have a first width W1 in one direction. The first width W1 may increase as approaching the top surface IL1U from the bottom surface IL1B of the first dielectric layer ILL The second bump part PT2 may have a second width W2 in the one direction. The second width W2 may be greater than the first width W1. The second bump part PT2 may cover the top surface IL1U of the first dielectric layer IL1. The under-bump UBM may include copper or nickel.

When viewed in plan as shown in FIG. 4, the first bump part PT1 may have a circular shape at the bottom surface PT1B thereof. When viewed in plan, the first sidewall SW1 of the first bump part PT1 and the bottom surface PT2B of the second bump part PT2 may each have an annular shape that surrounds the bottom surface PT1B of the first bump part PT1.

A first barrier/seed layer SL1 may be interposed between the under-bump UBM and the first dielectric layer ILL The first barrier/seed layer SL1 may include a barrier layer and a seed layer that are sequentially stacked. The barrier layer may include one or more of a titanium layer, a tantalum layer, a titanium nitride layer, and a tantalum nitride layer. The seed layer may include the same material as that of the under-bump UBM. The first barrier/seed layer SL1 may be in contact with the first sidewall SW1 and the bottom surface PT1B of the first bump part PT1 and with the bottom surface PT2B of the second bump part PT2.

The first barrier/seed layer SL1 (or the barrier layer thereof) may serve to reduce or prevent a constituent metal of the under-bump UBM from diffusing into the first dielectric layer ILL Therefore, the first barrier/seed layer SL1 may reduce or prevent a constituent metal of the under-bump UBM from reacting with a constituent material of the first dielectric layer ILL Accordingly, a void may be reduced or prevented from forming between the under-bump UBM and the first dielectric layer Ill, and thus the under-bump UBM may be reduced or prevented from cracking and/or delamination from the first dielectric layer ILL External connection terminals 100 may be bonded to the bottom surface IL1B of the first dielectric layer ILL The external connection terminal 100 may have a circular shape when viewed in plan. The external connection terminals 100 may be correspondingly connected through the first holes H1 to the under-bumps UBM. The external connection terminals 100 may each include a first terminal part 100a that is inserted into the first hole H1 and a second terminal part 100b that protrudes outwardly from the bottom surface IL1B of the first dielectric layer ILL The first and second terminal parts 100a and 100b may be integrally connected into a single piece. The external connection terminals 100 may include one or more of tin, lead, and silver. The external connection terminals 100 may be formed of SnAg, for example.

Referring back to FIG. 3A, the under-bump UBM may have a first thickness T1 at the second bump part PT2 thereof. The under-bump UBM may have a second thickness T2 at the first bump part PT1 thereof. The external connection terminal 100 may have a third thickness T3 at the first terminal part 100a thereof. The second thickness T2 may be about 0.8 times to about 1.2 times the third thickness T3. The first thickness T1 may be the same as, greater than, or less than the second thickness T2.

Referring again to FIG. 3A, a sidewall 100S1 of the first terminal part 100a and a top surface 100S2 of the second terminal part 100b may make therebetween an angle the same as the first angle θ1. Referring back to FIG. 3B, the first terminal part 100a may have a third width W3 in the one direction. The third width W3 may increase as approaching the top surface IL1U from the bottom surface IL1B of the first dielectric layer IL1. The second terminal part 100b may have a fourth width W4 in the one direction. The fourth width W4 may be greater than the third width W3. The fourth width W4 may be the same as or less than the second width W2.

The first hole H1 may have therein a wetting layer 5 interposed between the first barrier/seed layer SL1 and the external connection terminal 100. The wetting layer 5 may include, for example, gold. The wetting layer 5 may reduce or prevent oxidation of the under-bump UBM and/or the first barrier/seed layer SL1, may have improved wettability to the external connection terminal 100, may reduce or prevent contact failure between the under-bump UBM and the external connection terminal 100, and may reduce or prevent delamination of the external connection terminal 100.

The first barrier/seed layer SL1, the wetting layer 5, and the external connection terminal 100 may all be in contact with the inner sidewall SS of the first hole H1. The first barrier/seed layer SL1, the wetting layer 5, and the first terminal part 100a of the external connection terminal 100 may have their sidewalls that are aligned with each other. For example, the first barrier/seed layer SL1, the wetting layer 5, and the first terminal part 100a of the external connection terminal 100 may have their sidewalls that are disposed on a single straight line.

The first barrier/seed layer SL1 (or the barrier layer thereof) may serve to reduce or prevent a constituent metal of the under-bump UBM from diffusing into the wetting layer 5 and the external connection terminal 100. Therefore, the first barrier/seed layer SL1 may reduce or prevent a constituent metal of the under-bump UBM from reacting with a constituent material of the wetting layer 5 and a constituent material of the external connection terminal 100. Accordingly, a void may be reduced or prevented from forming between the under-bump UBM and the external connection terminal 100, and thus it may be possible to reduce or prevent contact failure and/or cracking between the under-bump UBM and the external connection terminal 100 and delamination of the external connection terminal 100.

Furthermore, as shown in FIG. 3A, an acute angle, or the first angle θ1, may be made between the sidewall 100S1 of the first terminal part 100a and the top surface 100S2 of the second terminal part 100b, and thus the external connection terminal 100 may be difficult to escape from the first hole H1. Accordingly, the external connection terminal 100 may be reduced or prevented from delamination.

Moreover, according to some example embodiments of the present inventive concepts, the first dielectric layer IL1 may partially cover and partially expose the under-bump UBM to thereby constitute a solder mask defined (SMD) structure, and accordingly, stress may be reduced between the under-bump UBM and the first dielectric layer IL1 and delamination of the under-bump UBM may be reduced or prevented. As a result, the semiconductor package 1000 may increase in reliability.

Referring also to FIG. 3A, the second dielectric layer IL2 may cover the under-bumps UBM and the first dielectric layer IL1. The under-bumps UBM may directly contact the second dielectric layer IL2. The first barrier/seed layer SL1 may not be interposed between the second dielectric layer IL2 and the under-bump UBM. Therefore, a constituent metal of the under-bump UBM may partially diffuse into the second dielectric layer IL2, and thus the constituent metal of the under-bump UBM and oxygen inside the second dielectric layer IL2 may react with each other to form a metal oxide layer CO of FIG. 3B. The metal oxide layer CO may be positioned between the under-bump UBM and the second dielectric layer IL2. In addition, because the constituent metal of the under-bump UBM partially diffuses into the second dielectric layer IL2, as shown in FIG. 3B, void regions VD may be formed on a surface of the under-bump UBM.

Referring back to FIGS. 1 and 2, a first redistribution pattern RP1 may be interposed between the second dielectric layer IL2 and the third dielectric layer IL3. A second barrier/seed layer SL2 may be interposed between the first redistribution pattern RP1 and the second dielectric layer IL2 and between the first redistribution pattern RP1 and the under-bump UBM.

A second redistribution pattern RP2 may be interposed between the third dielectric layer IL3 and the fourth dielectric layer IL4. A third barrier/seed layer SL3 may be interposed between the second redistribution pattern RP2 and the third dielectric layer IL3 and between the second redistribution pattern RP2 and the first redistribution pattern RP1.

A substrate conductive pattern 10 may be disposed on the fourth dielectric layer IL4. A portion of the substrate conductive pattern 10 may penetrate the fourth dielectric layer IL4 and may be connected to the second redistribution pattern RP2. A fourth barrier/seed layer SL4 may be interposed between the substrate conductive pattern 10 and the fourth dielectric layer IL4 and between the substrate conductive pattern 10 and the second redistribution pattern RP2.

The first redistribution pattern RP1, the second redistribution pattern RP2, and the substrate conductive pattern 10 may include, for example, one or more of copper, nickel, aluminum, and gold. The second to fourth barrier/seed layers SL2 to SL4 may have the same material and structure as those of the first barrier/seed layer SL1.

Each of the first and second redistribution patterns RP1 and RP2 may include a via part VP and a line part LP that is positioned on the via part VP and has a linear shape. The via part VP and the line part LP may be integrally connected into a single piece. The via part VP may have a width that decreases in a downward direction. For example, the via part VP of the first redistribution pattern RP1 may have a fifth width W5 in the one direction as shown in FIG. 3B. The fifth width W5 may increase in an upward direction. The fifth width W5 may be less than the first to fourth widths W1 to W4.

The first semiconductor device CH1 may be a single semiconductor die or chip, or a semiconductor package that includes a plurality of semiconductor dies of the same type or different types. The first semiconductor device CH1 may be one selected from an image sensor chip such as CMOS image sensor (CIS), a microelectromechanical system (MEMS) device chip, an application specific integrated circuit (ASIC) chip, and a memory device chip such as Flash memory, DRAM, SRAM, EEPROM, PRAM, MRAM, ReRAM, HBM (high bandwidth memory), and HMC (hybrid memory cubic).

The first semiconductor device CH1 may be flip-chip bonded through first internal connection members 110 to the first redistribution substrate RD1. The first internal connection members 110 may electrically connect the substrate conductive patterns 10 to chip pads 105 of the first semiconductor device CH1. The first internal connection members 110 may include one or more of solder balls, conductive bumps, and conductive pillars. The first internal connection members 110 may include one or more of tin, lead, silver, copper, nickel, and gold.

The first mold layer MD1 may cover a sidewall of the first semiconductor device CH1, a top surface of the first semiconductor device CH1, and a top surface of the first redistribution substrate RD1. The first mold layer MD1 may include a dielectric resin, such as epoxy molding compound (EMC). The first mold layer MD1 may further include fillers, and the fillers may be dispersed in the dielectric resin.

A first under-fill layer UF1 may be interposed between the first semiconductor device CH1 and the first redistribution substrate RD1. The first under-fill layer UF1 may include a thermo-curable resin or a photo-curable resin. In addition, the first under-fill layer UF1 may further include organic fillers or inorganic fillers.

FIGS. 5A to 5I illustrate enlarged partial cross-sectional views showing a method of fabricating the semiconductor package of FIG. 1 according to some example embodiments of the present inventive concepts.

Figure 5A:
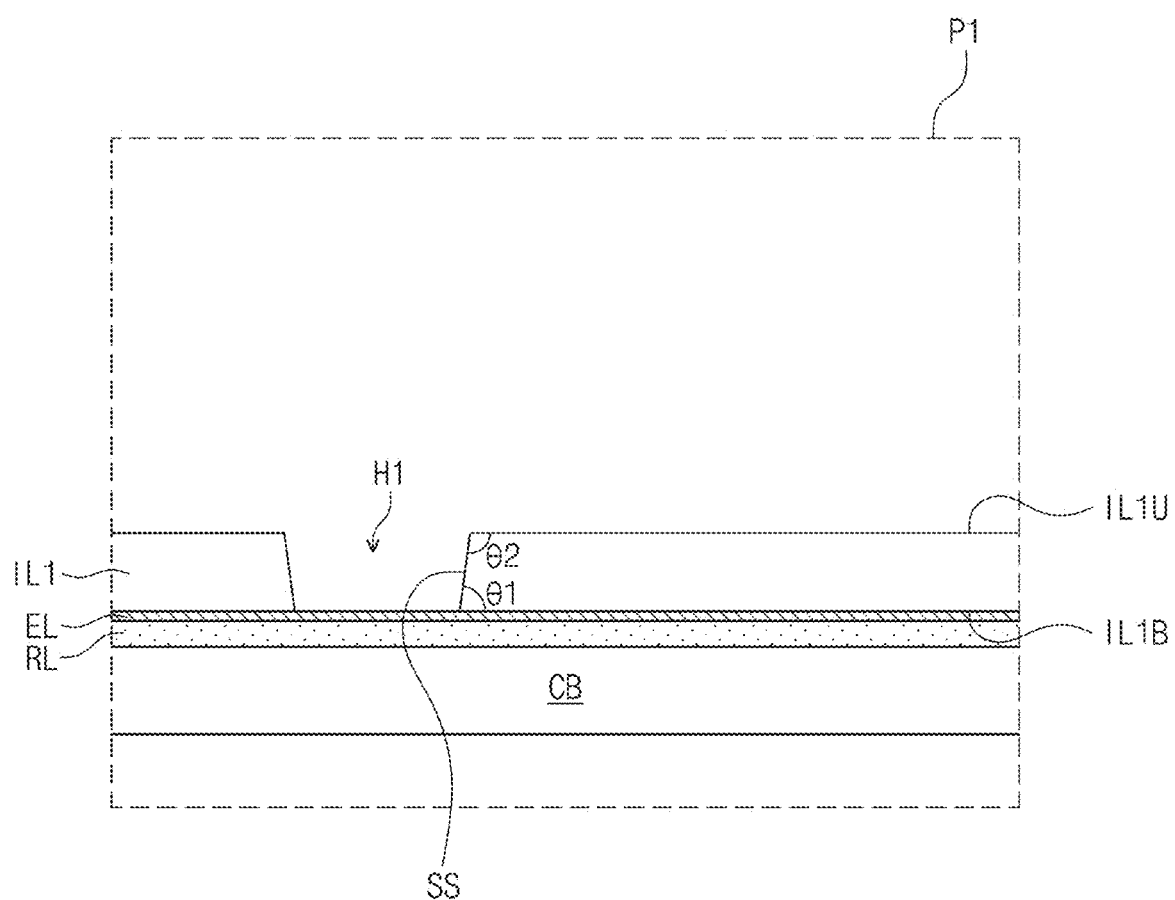
FIGS. 5A to 5I illustrate enlarged partial cross-sectional views showing a method of fabricating the semiconductor package of FIG. 1 according to some example embodiments of the present inventive concepts.

Referring to FIG. 5A, a carrier substrate CB may be prepared. The carrier substrate CB may be, for example, a transparent glass substrate. A release layer RL may be formed on the carrier substrate CB. The release layer RL may include an epoxy resin. The release layer RL may exhibit, for example, photodegradability or thermodegradability. An etch stop layer EL may be formed on the release layer RL. The etch stop layer EL may include a conductive material having an etch selectivity with respect to the release layer RL. For example, the etch stop layer EL may include metal, such as titanium. A first dielectric layer IL1 may be formed on the etch stop layer EL. The first dielectric layer IL1 may be formed by coating, exposure, and development processes. The exposure and development processes may cause the first dielectric layer IL1 to form including first holes H1 that expose the etch stop layer EL.

Additionally, the first dielectric layer IL1 may be cured. Therefore, the first dielectric layer IL1 may contract. In some example embodiments, the first dielectric layer IL1 may have a bottom surface IL1B that is in contact with the etch stop layer EL and is fixed by the etch stop layer EL, and thus the first dielectric layer IL1 may be difficult to contract a lower portion thereof. In contrast, the first dielectric layer IL1 may have a top surface IL1U that is not fixed by the etch stop layer EL, and thus the first dielectric layer IL1 may be easy to contract an upper portion thereof. The first holes H1 may thus have their inclined inner sidewalls SS. For example, the inner sidewalls SS of the first holes H1 may make a first angle θ1 with the bottom surface IL1B of the first dielectric layer IL1. The inner sidewalls SS of the first holes H1 may make a second angle θ2 with the top surface IL1U of the first dielectric layer IL1. The first angle θ1 may be less than the second angle θ2.

Figure 5B:
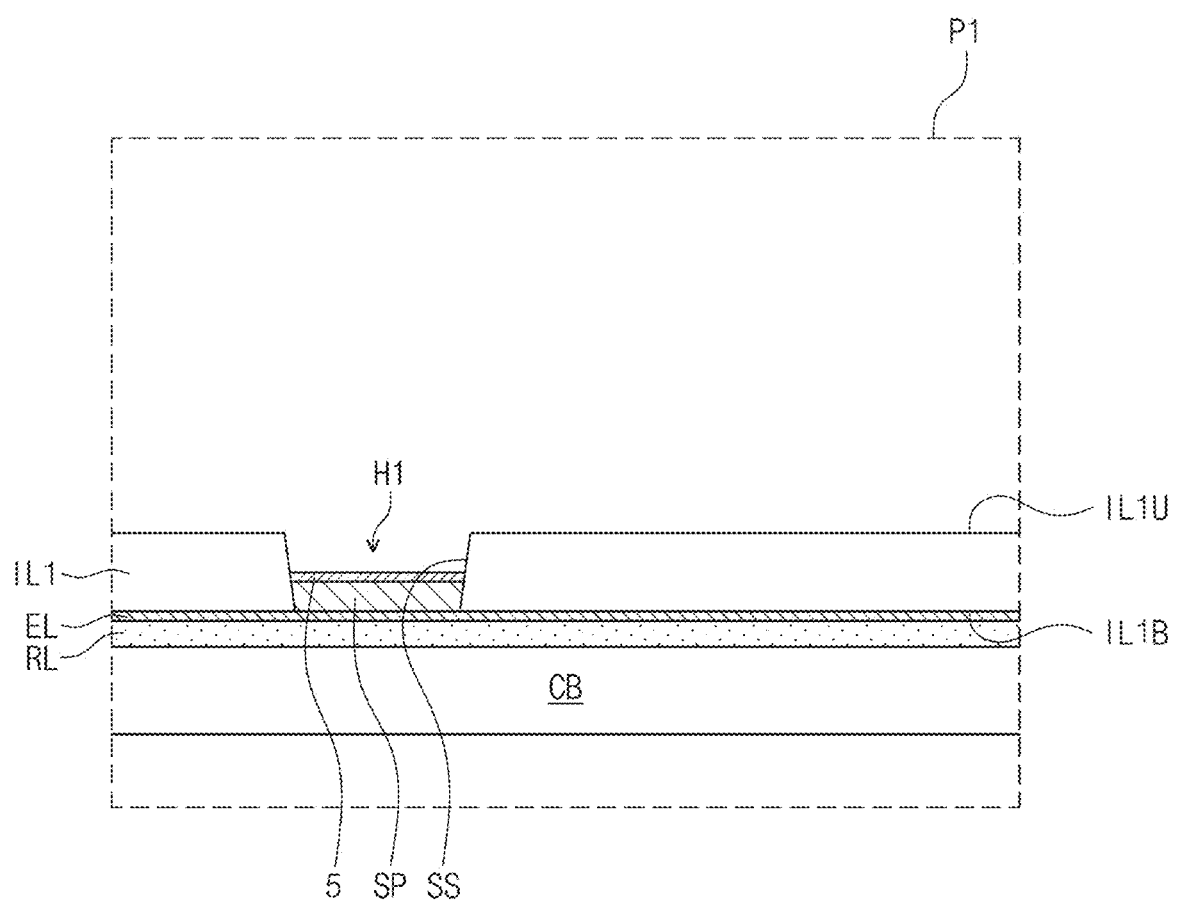

Referring to FIG. 5B, a sacrificial pattern SP and a wetting layer 5 may be sequentially formed in the first hole H1. The sacrificial pattern SP and the wetting layer 5 may each be formed by electroplating. The sacrificial pattern SP and the wetting layer 5 may not completely fill the first hole H1 and may expose an upper portion of the inner sidewall SS of the first hole H1. The sacrificial pattern SP may include a conductive material having an etch selectivity with respect to both the etch stop layer EL and the wetting layer 5. The sacrificial pattern SP may include metal different from those of the etch stop layer EL and the wetting layer 5. For example, the sacrificial pattern SP may include nickel. The wetting layer 5 may include gold (Au).

Figure 5C:
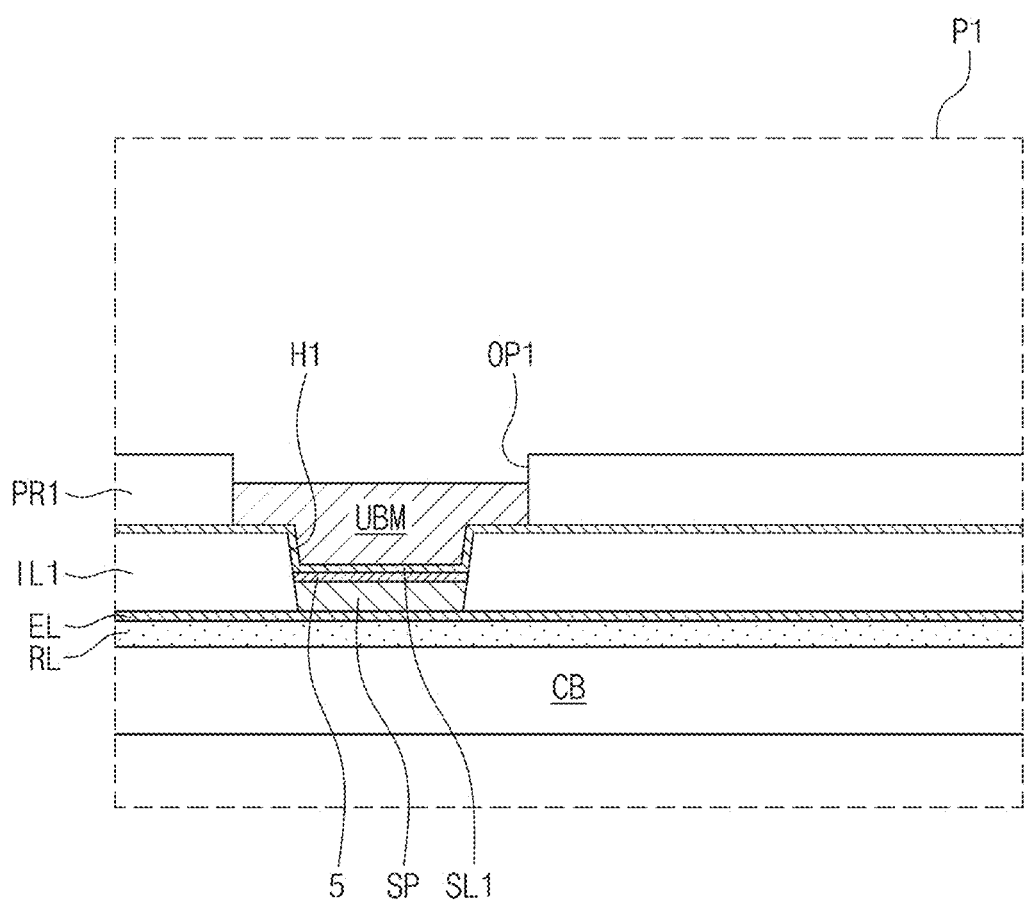

Referring to FIG. 5C, a first barrier/seed layer SL1 may be conformally formed on the wetting layer 5 and the first dielectric layer IL1. The first barrier/seed layer SL1 may be formed by sequentially stacking a barrier layer and a seed layer. A first mask pattern PR1 may be formed on the first barrier/seed layer SL1. The first mask pattern PR1 may include a first opening OP1 that overlaps the first hole H1. The first opening OP1 may expose the first barrier/seed layer SL1. The first mask pattern PR1 may be, for example, a photoresist pattern. An electroplating process may be performed to form an under-bump UBM on the first barrier/seed layer SL1. The under-bump UBM may fill the first hole H1 and may fill at least a portion of the first opening OP1. The under-bump UBM may expose a top surface of the first mask pattern PR1.

Figure 5D:
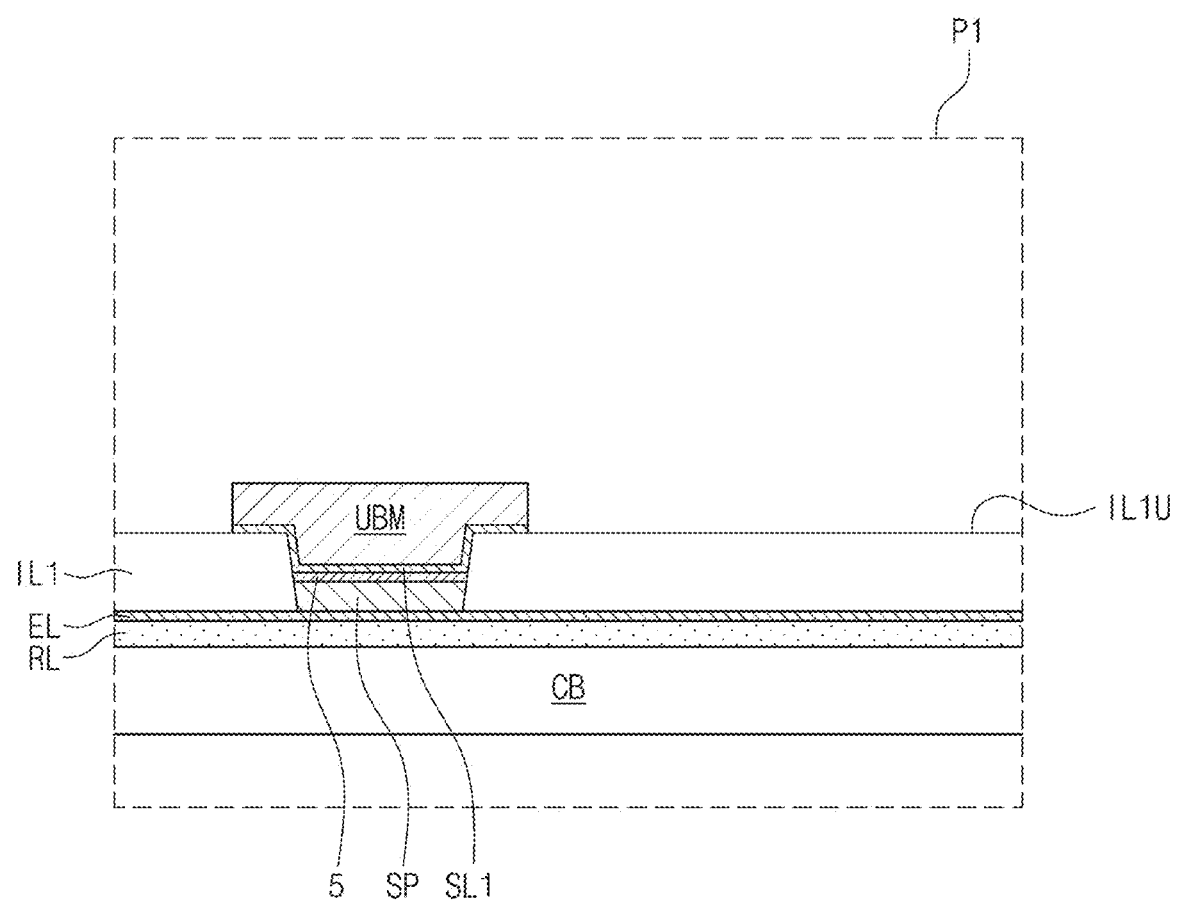

Referring to FIGS. 5C and 5D, the first mask pattern PR1 may be removed to expose a top surface of the first barrier/seed layer SL1 and a lateral surface of the under-bump UBM. When the first mask pattern PR1 is a photoresist pattern, an ashing process may be employed to remove the first mask pattern PR1. The first barrier/seed layer SL1 exposed on a side of the under-bump UBM may be removed to expose the top surface IL1U of the first dielectric layer IL1.

Figure 5E:
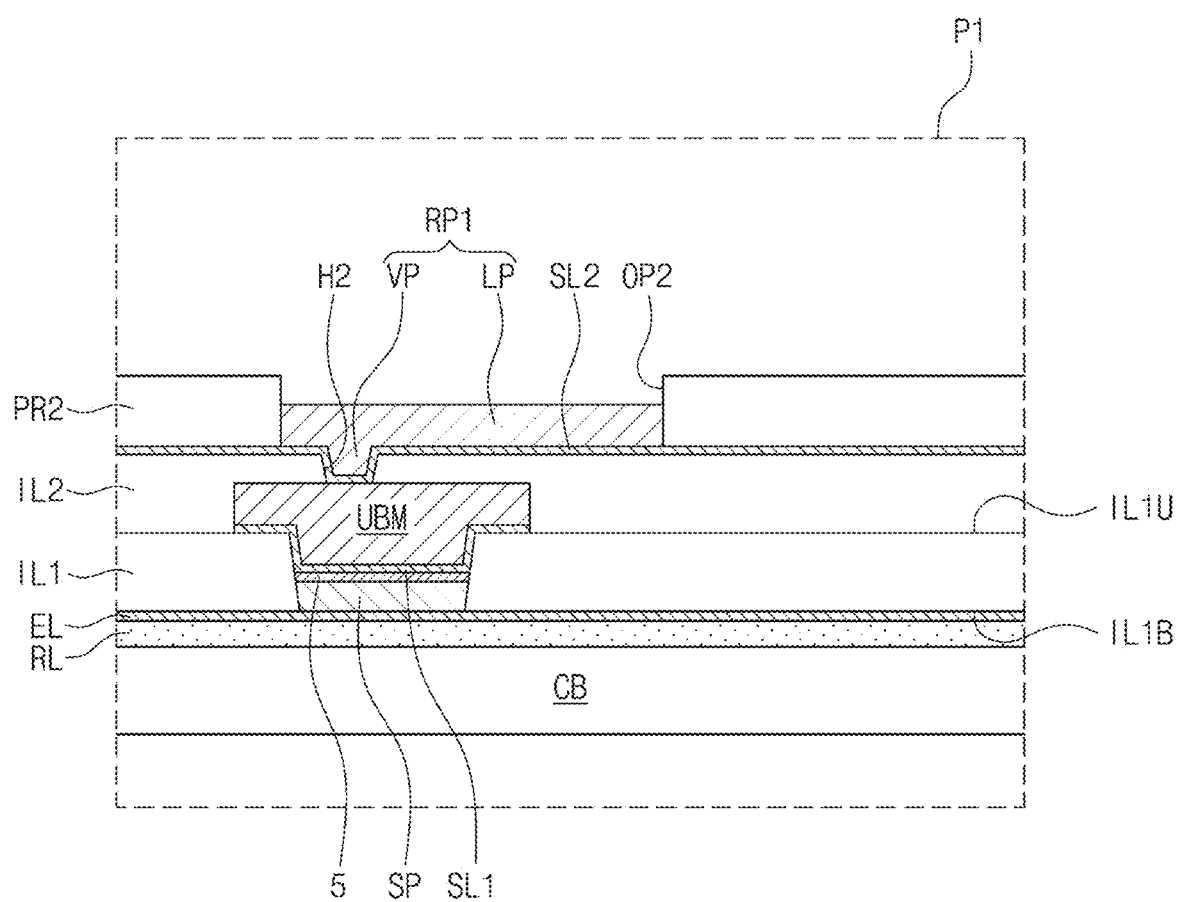

Referring also to FIG. 5E, a second dielectric layer IL2 may be formed on the under-bump UBM and the first dielectric layer IL1. The second dielectric layer IL2 may be formed by coating, exposure, development, and curing processes. The second dielectric layer IL2 may be formed to include a second hole H2 that exposes a top surface of the under-bump UBM. A second barrier/seed layer SL2 may be conformally formed on the second dielectric layer IL2. A second mask pattern PR2 may be formed on the second barrier/seed layer SL2. The second mask pattern PR2 may be, for example, a photoresist pattern. The second mask pattern PR2 may be formed to include a second opening OP2 that overlaps the second hole H2 and exposes a portion of the second barrier/seed layer SL2. An electroplating process may be performed to form a first redistribution pattern RP1 in the second hole H2 and the second opening OP2. The first redistribution pattern RP1 may be formed to include a via part VP that fills the second hole H2 and a line part LP that lies in the second opening OP2.

Figure 5F:
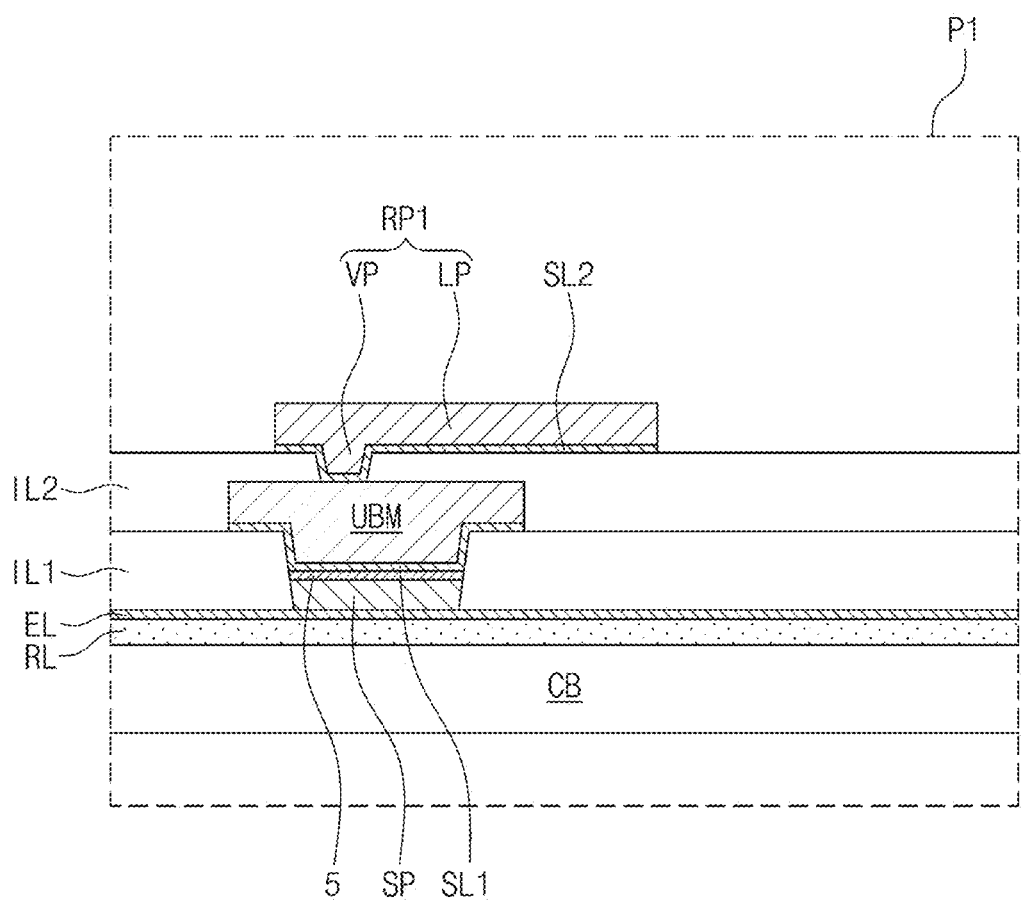

Referring to FIGS. 5E and 5F, the second mask pattern PR2 and its underlying second barrier/seed layer SL2 may be removed to expose a top surface of the second dielectric layer IL2.

Figure 5G:
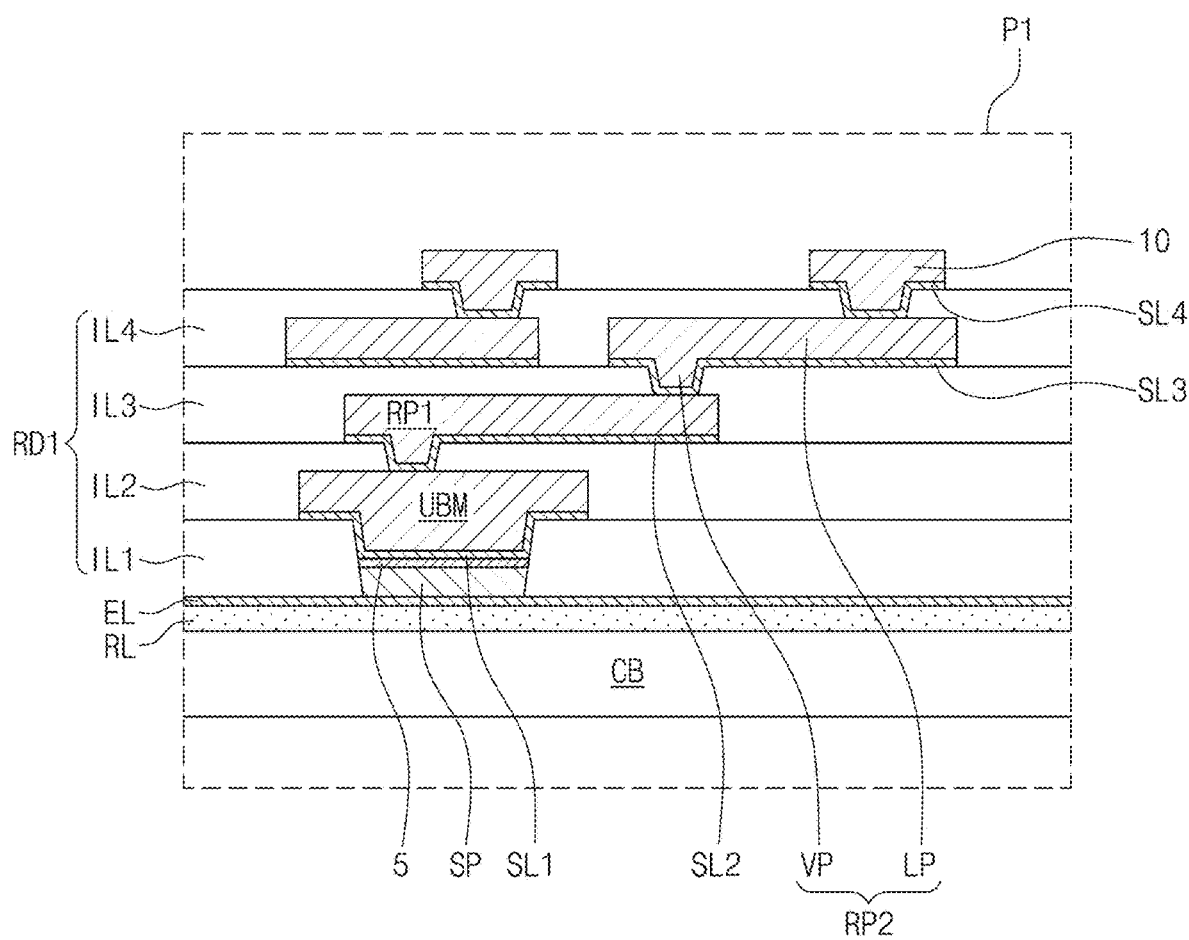

Referring to FIG. 5G, a third dielectric layer IL3 may be formed to expose the first redistribution pattern RP1 and the second dielectric layer IL2. A third barrier/seed layer SL3 and a second redistribution pattern RP2 may be formed by using the same method as that discussed with reference to FIGS. 5E and 5F. A fourth dielectric layer IL4 may be formed to cover the second redistribution pattern RP2 and the third dielectric layer IL3. A fourth barrier/seed layer SL4 and a substrate conductive pattern 10 may be formed by using the same method as that discussed with reference to FIGS. 5E and 5F. Accordingly, a first redistribution substrate RD1 may be formed.

Figure 5H:
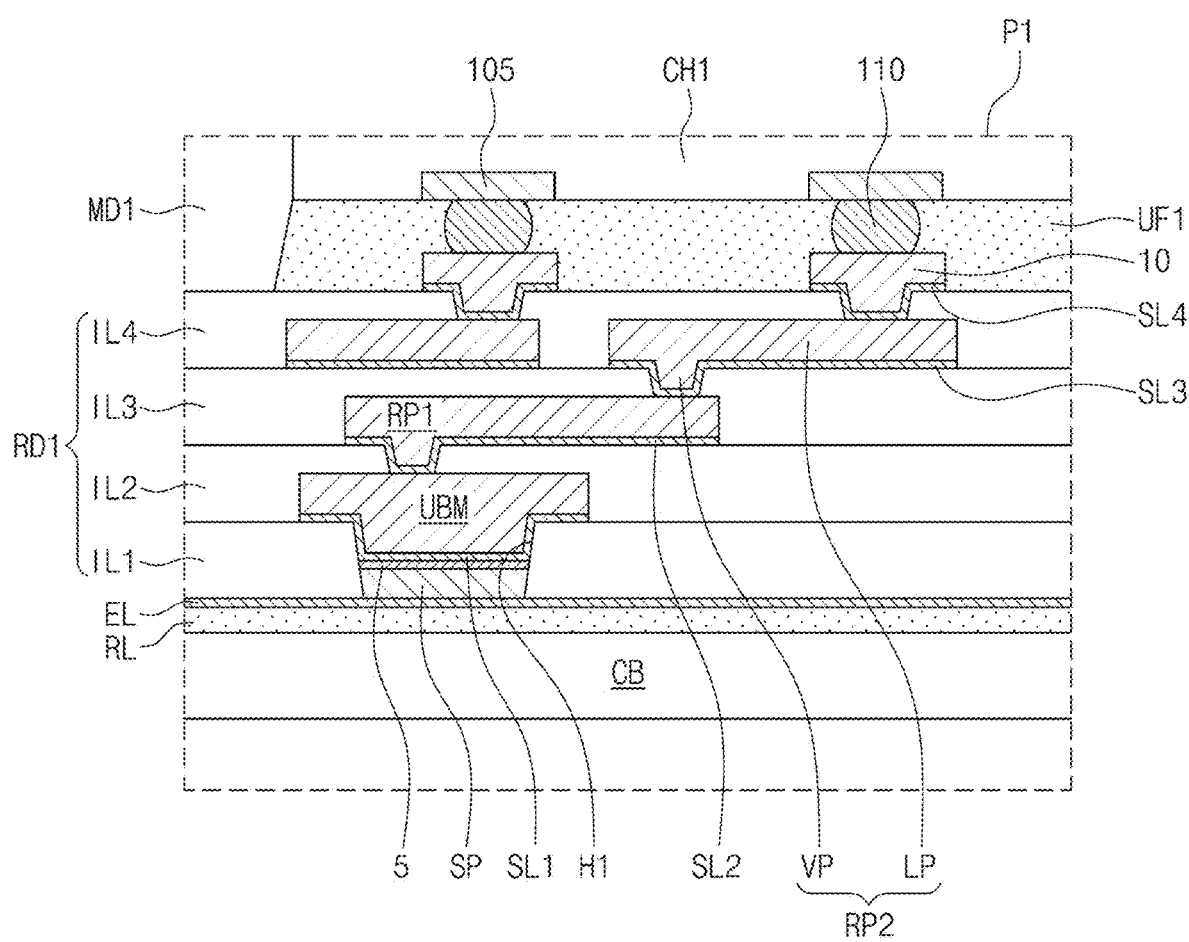

Referring to FIGS. 1, 5G, and 5H, a first internal connection member 110 may be used to mount a first semiconductor device CH1 on the first redistribution substrate RD1. A first under-fill layer UF1 may be formed between the first semiconductor device CH1 and the first redistribution substrate RD1. A first mold layer MD1 may be formed to cover the first redistribution substrate RD1 and the first semiconductor device CH1.

Figure 5I:
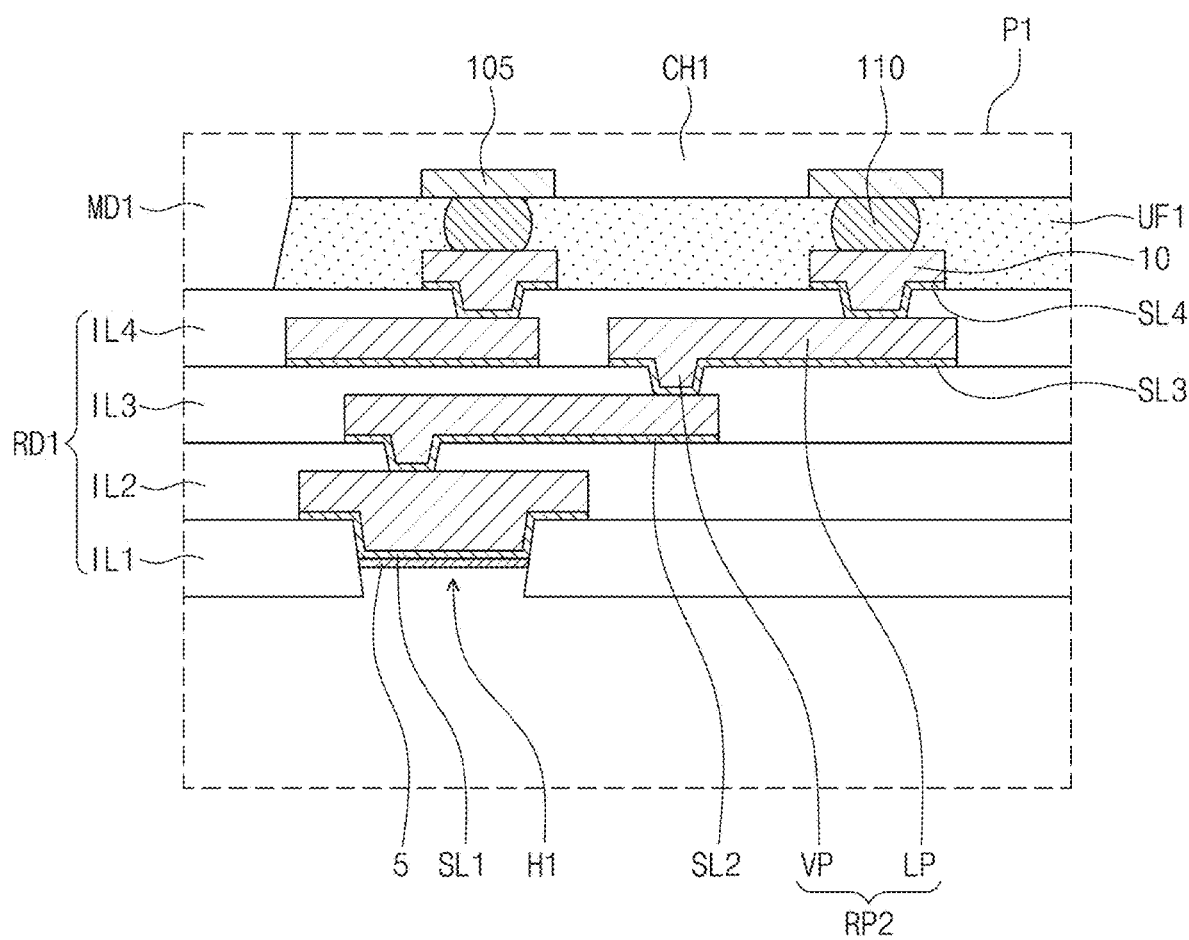

Referring to FIGS. 5H and 5I, the carrier substrate CB may be separated from the etch stop layer EL. When the release layer RL is a photo-degradable layer, an ultraviolet ray UV may be irradiated through the carrier substrate CB to the release layer RL so as to separate the carrier substrate CB. Alternatively, when the release layer RL is a thermo-degradable layer, high-temperature heat may be applied through the carrier substrate CB to the release layer RL so as to separate the carrier substrate CB. Alternatively, a lateral surface of the release layer RL may be provided with a mechanical force to physically separate the carrier substrate CB from the etch stop layer EL. After the separation of the carrier substrate CB, at least a portion of the release layer RL may remain on the etch stop layer EL. A first etching process may be performed in which the release layer RL may be removed to expose a surface of the etch stop layer EL. In some example embodiments, the etch stop layer EL may reduce or prevent the wetting layer 5 from receiving a first etchant used for the first etching process. A second etching process may be performed in which the etch stop layer EL may be removed to expose a bottom surface of the first dielectric layer IL1 and a bottom surface of the sacrificial pattern SP. The sacrificial pattern SP may reduce or prevent the wetting layer 5 from receiving a second etchant used for the second etching process. A third etching process may be performed in which the sacrificial pattern SP may be removed to expose a surface of the wetting layer 5 and a lower inner sidewall of the first hole H1. Subsequently, referring back to FIG. 2, an external connection terminal 100 may be bonded to the wetting layer 5 exposed through the first hole H1. A singulation process may be performed to separate semiconductor packages from each other. Accordingly, a semiconductor package 1000 may be eventually fabricated as shown in FIGS. 1 and 2.

In a method of fabricating a semiconductor package according to some example embodiments of the present inventive concepts, the etch stop layer EL and the sacrificial pattern SP may be used such that the wetting layer 5, the first barrier/seed layer SL1, and the under-bump UBM may be formed without failure thereof. As a result, a yield may increase.

Moreover, the semiconductor package fabrication method may include an operation of forming the wetting layer 5, and thus it may be possible to reduce or prevent oxidation of the under-bump UBM and/or the first barrier/seed layer SL1. Therefore, contact failure may be reduced or prevented between the under-bump UBM and the external connection terminal 100. In addition, when the wetting layer 5 is absent, a problem may occur in which the external connection terminal 100 is not bonded to the under-bump UBM or the first barrier/seed layer SL1. The present inventive concepts may include an operation of forming the wetting layer 5, and accordingly may reduce or prevent process failure and may increase a yield.

Figure 6:
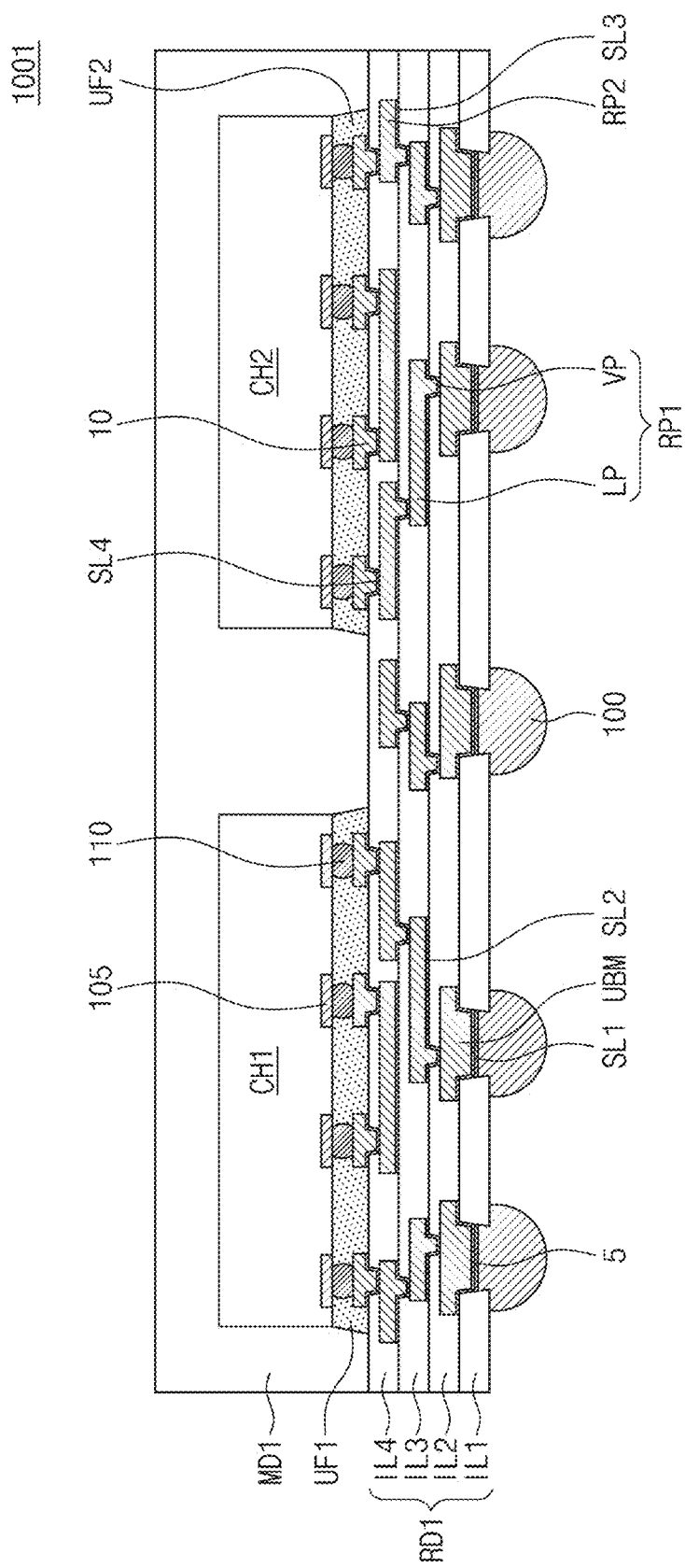
FIG. 6 illustrates a cross-sectional view showing a semiconductor package according to some example embodiments of the present inventive concepts.

FIG. 6 illustrates a cross-sectional view showing a semiconductor package according to some example embodiments of the present inventive concepts.

Referring to FIG. 6, a semiconductor package 1001 according to the present example embodiments may be configured such that a first semiconductor device CH1 and a second semiconductor device CH2 may be mounted side by side on the first redistribution substrate RD1. The first semiconductor device CH1 may be spaced apart from the second semiconductor device CH2. The first under-fill layer UF1 may be interposed between the first semiconductor device CH1 and the first redistribution substrate RD1. A second under-fill layer UF2 may be interposed between the second semiconductor device CH2 and the first redistribution substrate RD1. The first and second semiconductor devices CH1 and CH2 may be of the same type or of different types. The first mold layer MD1 may cover the first semiconductor device CH1 and the second semiconductor device CH2. In the present example embodiments, two semiconductor devices CH1 and CH2 are mounted side by side, but the number of the semiconductor devices CH1 and CH2 may be three or more. Other configurations may be identical or similar to those discussed with reference to FIGS. 1 to 4.

Figure 7:
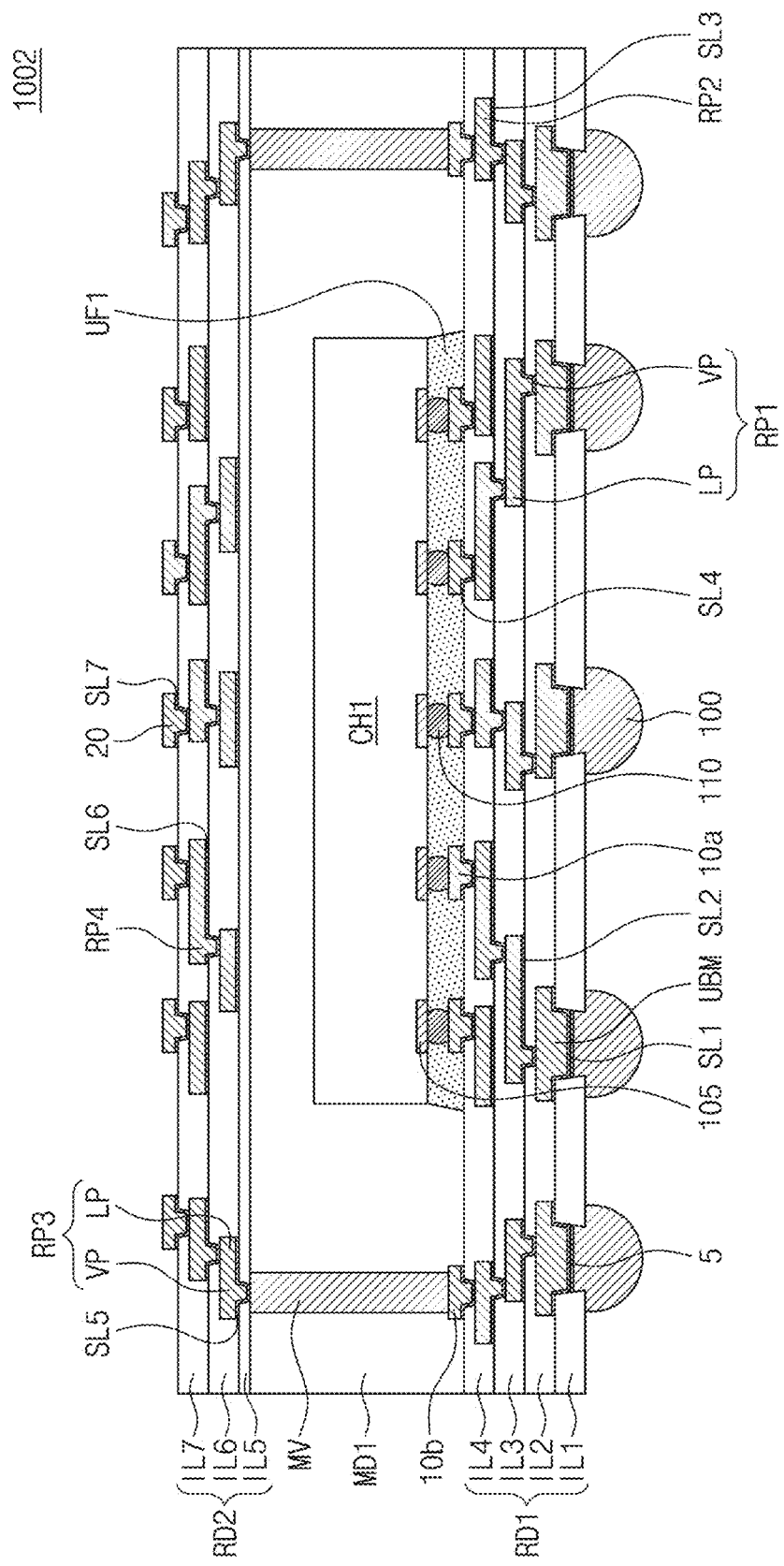
FIG. 7 illustrates a cross-sectional view showing a semiconductor package according to some example embodiments of the present inventive concepts.

FIG. 7 illustrates a cross-sectional view showing a semiconductor package according to some example embodiments of the present inventive concepts.

Referring to FIG. 7, a semiconductor package 1002 according to the present example embodiments may include a first redistribution substrate RD1 including a first substrate conductive pattern 10a and a second substrate conductive pattern 10b. The first substrate conductive pattern 10a may be connected to the first internal connection member 110. The semiconductor package 1002 may further include a second redistribution substrate RD2 disposed on the first mold layer MD1 and a mold via MV that penetrates the first mold layer MD1 and connects the first redistribution substrate RD1 to the second redistribution substrate RD2. The mold via MV may contact the second substrate conductive pattern 10b. The mold via MV may include a conductive material, such as copper. The mold via MV may directly contact the first mold layer MD1.

The second redistribution substrate RD2 may include fifth, sixth, and seventh dielectric layers IL5, IL6, and IL7 that are sequentially stacked. The fifth to seventh dielectric layers IL5 to IL7 may each include a photo-imageable dielectric (PID) layer. A third redistribution pattern RP3 may be interposed between the fifth dielectric layer IL5 and the sixth dielectric layer IL6. A fifth barrier/seed layer SL5 may be interposed between the third redistribution pattern RP3 and the fifth dielectric layer IL5. The third redistribution pattern RP3 may be connected to the mold via MV. A fourth redistribution pattern RP4 may be interposed between the sixth dielectric layer IL6 and the seventh dielectric layer IL7. A sixth barrier/seed layer SL6 may be interposed between the fourth redistribution pattern RP4 and the sixth dielectric layer IL6. The third and fourth redistribution patterns RP3 and RP4 may each include a via part VP and a line part LP. A third substrate conductive pattern 20 may be disposed on the seventh dielectric layer IL7. A seventh barrier/seed layer SL7 may be interposed between the third substrate conductive pattern 20 and the seventh dielectric layer IL7. The third redistribution pattern RP3, the fourth redistribution pattern RP4, and the third substrate conductive pattern 20 may each include, for example, one or more of copper, nickel, aluminum, and gold. The fifth to seventh barrier/seed layers SL5 to SL7 may each have the same material and structure as those of the first barrier/seed layer SL1. Other configurations may be identical or similar to those discussed with reference to FIGS. 1 to 4.

Figure 8:
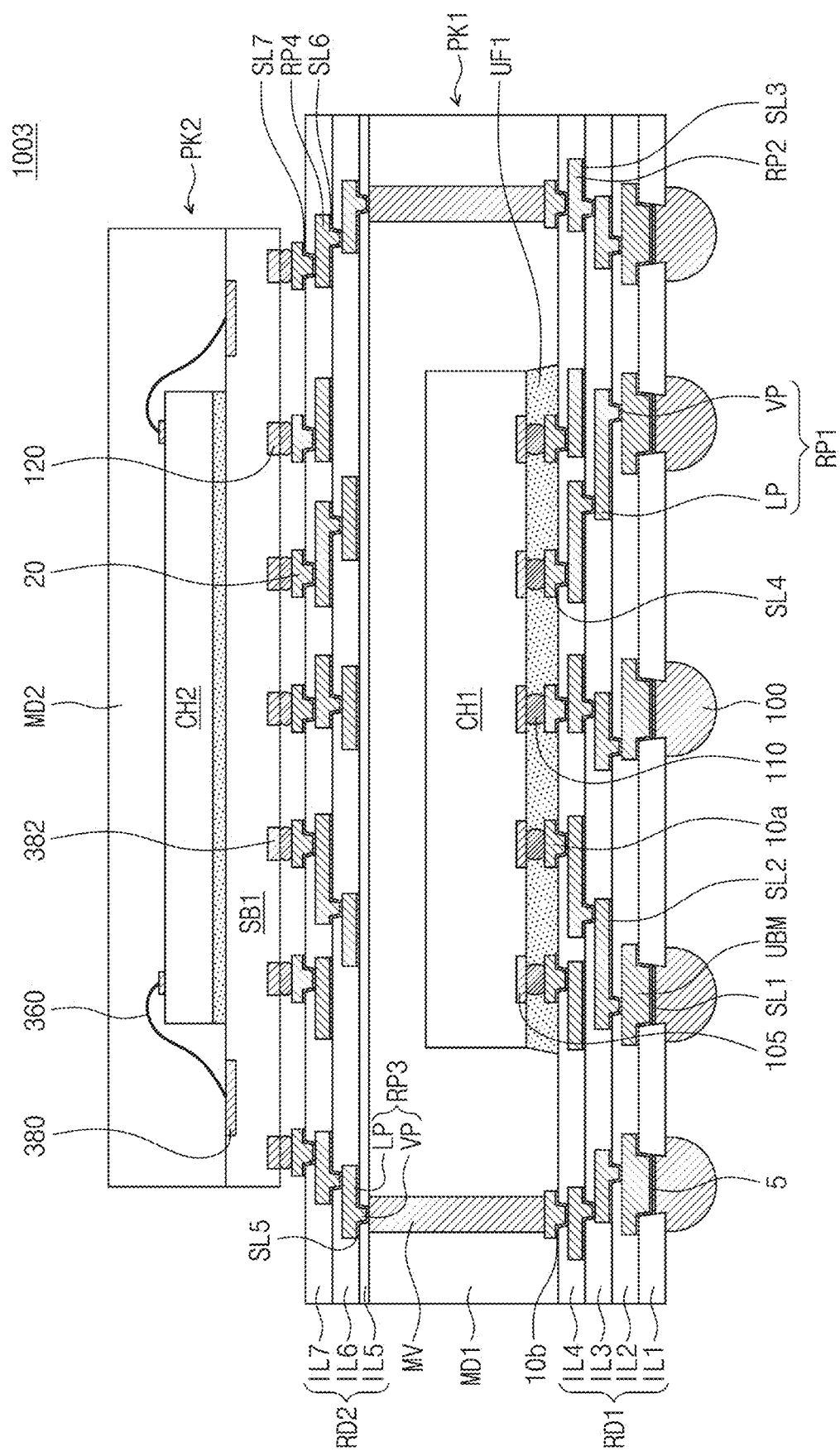
FIG. 8 illustrates a cross-sectional view showing a semiconductor package according to some example embodiments of the present inventive concepts.

FIG. 8 illustrates a cross-sectional view showing a semiconductor package according to some example embodiments of the present inventive concepts.

Referring to FIG. 8, a semiconductor package 1003 according to the present example embodiments may include a first sub-semiconductor package PK1 and a second sub-semiconductor package PK2 stacked on the first sub-semiconductor package PK1. The first sub-semiconductor package PK1 may have a structure the same as or similar to that of the semiconductor package 1002 of FIG. 7. The second sub-semiconductor package PK2 may include a first package substrate SB1, a second semiconductor device CH2 mounted on the first package substrate SB1, and a second mold layer MD2 that covers the second semiconductor device CH2 and the first package substrate SB1. The second semiconductor device CH2 may be electrically connected to the first package substrate SB1 through, for example, a wire 360. The second semiconductor device CH2 may be a single semiconductor die or chip, or a semiconductor package that includes a plurality of semiconductor dies of the same type or different types. The second semiconductor device CH2 may be one selected from an image sensor chip such as CMOS image sensor (CIS), a microelectromechanical system (MEMS) device chip, an application specific integrated circuit (ASIC) chip, and a memory device chip such as Flash memory, DRAM, SRAM, EEPROM, PRAM, MRAM, ReRAM, HBM (high bandwidth memory), and HMC (hybrid memory cubic).

The second mold layer MD2 may include the same material as that of the first mold layer MD1. The wire 360 may include copper or gold. The first package substrate SB1 may be, for example, bi-layered or multi-layered printed circuit board. The first package substrate SB1 may include an upper conductive pattern 380 disposed on a top surface thereof and a lower conductive pattern 382 disposed on a bottom surface thereof. The first package substrate SB1 may have therein an internal wiring line (not shown) to connect the upper conductive pattern 380 to the lower conductive pattern 382. The upper and lower conductive patterns 380 and 382 may include, for example, one or more of gold, copper, aluminum, and nickel.

The first sub-semiconductor package PK1 may be connected through a second internal connection member 120 to the second sub-semiconductor package PK2. The second internal connection member 120 may connect the lower conductive pattern 382 to the third substrate conductive pattern 20. The second internal connection member 120 may include one or more of solder balls, conductive bumps, and conductive pillars. The second internal connection member 120 may include one or more of tin, lead, silver, copper, nickel, and gold. Other configurations may be identical or similar to those discussed with reference to FIG. 7.

Figure 9:
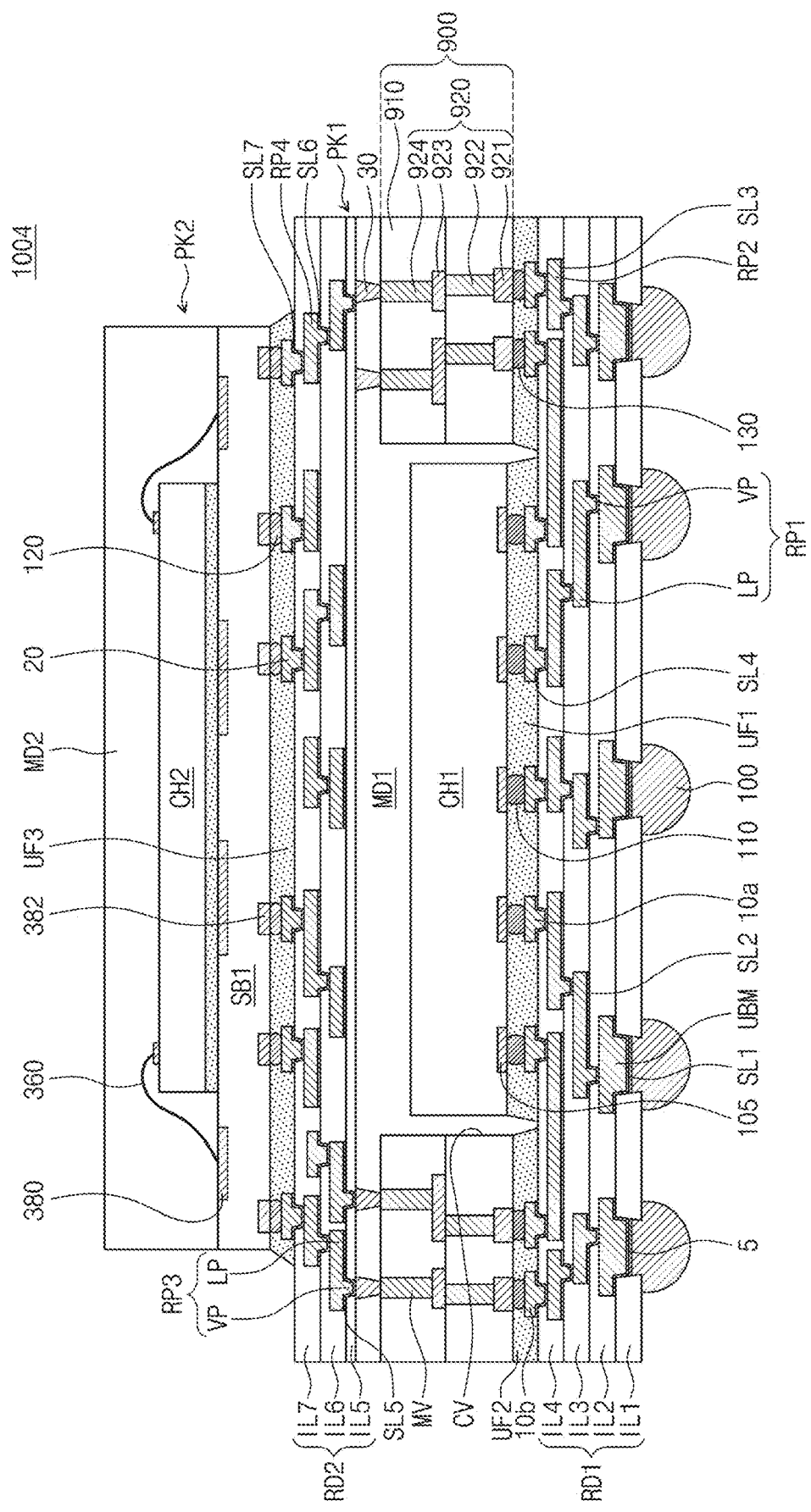
FIG. 9 illustrates a cross-sectional view showing a semiconductor package according to some example embodiments of the present inventive concepts.

FIG. 9 illustrates a cross-sectional view showing a semiconductor package according to some example embodiments of the present inventive concepts.

Referring to FIG. 9, a semiconductor package 1004 according to the present example embodiments may include a first sub-semiconductor package PK1 including a first redistribution substrate RD1, a connection substrate 900 and a first semiconductor device CH1 that are mounted on the first redistribution substrate RD1, a first mold layer MD1 that covers the connection substrate 900 and the first semiconductor device CH1, and a second redistribution substrate RD2 on the first mold layer MD1.

A first under-fill layer UF1 may be interposed between the first semiconductor device CH1 and the first redistribution substrate RD1. The connection substrate 900 may include a cavity region CV at a center thereof. The first semiconductor device CH1 may be disposed in the cavity region CV. The connection substrate 900 may include a plurality of base layers 910 and a conductive structure 920. The base layers 910 may include a dielectric material. For example, the base layers 910 may include a carbon-based material, a ceramic, or a polymer. The conductive structure 920 may include a connection pad 921, a first connection via 922, a connection line 923, and a second connection via 924.

The connection substrate 900 may be connected through a third internal connection member 130 to the first redistribution substrate RD1. A second under-fill layer UF2 may be interposed between the connection substrate 900 and the first redistribution substrate RD1. The first mold layer MD1 may fill a space between the first semiconductor device CH1 and an inner sidewall of the cavity region CV of the connection substrate 900. The second under-fill layer UF2 may include the same material as that of the first under-fill layer UF1.

A subsidiary via 30 may penetrate the first mold layer MD1 and may connect the second connection via 924 of the connection substrate 900 to the third redistribution pattern RP3 of the second redistribution substrate RD2. A third under-fill layer UF3 may fill a space between the first sub-semiconductor package PK1 and the second sub-semiconductor package PK2. The third under-fill layer UF3 may include the same material as that of the first under-fill layer UF1. Other configurations may be identical or similar to those discussed with reference to FIG. 8.

A semiconductor package according to the present inventive concepts may be configured such that an under-bump and a first dielectric layer may have therebetween a first barrier/seed layer to reduce or prevent the under-bump from being delaminated from the first dielectric layer. Moreover, the first barrier/seed layer may be interposed between the under-bump and an external connection terminal, and may thus reduce or prevent delamination of the external connection terminal.

Furthermore, the under-bump and the external connection terminal may have therebetween a wetting layer to reduce or prevent contact failure between the under-bump and the external connection terminal and delamination of the external connection terminal.

In addition, an acute angle, or a first angle, may be made between a sidewall of a first terminal part of the external connection terminal and a top surface of a second terminal part of the external connection terminal, and thus the external connection terminal may be difficult to escape from a first hole. Accordingly, the external connection terminal may be reduced or prevented from delamination.

A method of fabricating a semiconductor package according to the present inventive concepts, an etch stop layer and a sacrificial pattern may be used such that a wetting layer, a first barrier/seed layer, and an under-bump may be formed without failure thereof. As a result, a yield may increase.

Although the present inventive concepts have been described in connection with some example embodiments of the present inventive concepts illustrated in the accompanying drawings, it will be understood to those skilled in the art that various changes and modifications may be made without departing from the technical spirit and essential feature of the present inventive concepts. The above disclosed example embodiments should thus be considered illustrative and not restrictive. The example embodiments of FIGS. 1 to 9 may be combined with each other.

What is claimed is:

1. A semiconductor package, comprising:
a first redistribution substrate; and
a first semiconductor device on the first redistribution substrate,
wherein the first redistribution substrate includes:
a first dielectric layer that includes a first hole;
an under-bump that includes a first bump part in the first hole and a second bump part that protrudes from the first bump part onto the first dielectric layer;
an external connection terminal on a bottom surface of the first dielectric layer and connected to the under-bump through the first hole;
a wetting layer between the external connection terminal and the under-bump; and
a first barrier/seed layer on a top surface of the first dielectric layer, between the under-bump and the first dielectric layer, and between the under-bump and the wetting layer, the top and bottom surfaces being opposite surfaces of the first dielectric layer, and
wherein a sidewall of the external connection terminal, a sidewall of the wetting layer, and a sidewall of the first barrier/seed layer are in direct contact with an inner sidewall of the first hole,
wherein the first redistribution substrate further includes
a second dielectric layer that covers the first dielectric layer and the second bump part of the under-bump; and
a metal oxide layer between the second bump part and the second dielectric layer; and
a void region between the second bump part and the metal oxide layer.

2. The semiconductor package of claim 1, wherein the inner sidewall of the first hole makes a first angle with the bottom surface of the first dielectric layer,
wherein the first angle is an acute angle that ranges from about 45° to less than 90°.

3. The semiconductor package of claim 1, wherein the external connection terminal includes:
a first terminal part in the first hole; and
a second terminal part that protrudes outwardly from the bottom surface of the first dielectric layer,
wherein a sidewall of the first terminal part makes a first angle with a top surface of the second terminal part,
wherein the first angle is an acute angle that ranges from about 45° to less than 90°.

4. The semiconductor package of claim 1, wherein the external connection terminal includes:
a first terminal part in the first hole; and
a second terminal part that protrudes outwardly from the bottom surface of the first dielectric layer,
wherein a width of the second terminal part is greater than a width of the first terminal part.

5. The semiconductor package of claim 1, wherein a sidewall of the first bump part makes a first angle with a bottom surface of the second bump part,
wherein the first angle ranges from about 90° to about 135°.

6. The semiconductor package of claim 1, wherein a width of the second bump part is greater than a width of the first bump part.

7. The semiconductor package of claim 1, wherein the sidewall of the external connection terminal, the sidewall of the wetting layer, and the sidewall of the first barrier/seed layer are aligned with each other.

8. The semiconductor package of claim 1, wherein the first redistribution substrate further includes:
a second dielectric layer that covers the first dielectric layer and the second bump part of the under-bump; and
a first redistribution pattern that penetrates the second dielectric layer and is connected to the under-bump,
wherein the second bump part is in direct contact with the second dielectric layer.

9. The semiconductor package of claim 8, wherein the first redistribution pattern includes a via part that penetrates the second dielectric layer and a line part that protrudes onto the second dielectric layer,
wherein a width of the via part is less than a width of the first bump part.

10. A semiconductor package, comprising:
a first redistribution substrate; and
a first semiconductor device on the first redistribution substrate,
wherein the first redistribution substrate includes
a first dielectric layer that includes a first hole;
an under-bump that includes a first bump part in the first hole and a second bump part that protrudes from the first bump part onto the first dielectric layer;
an external connection terminal on a bottom surface of the first dielectric layer and connected to the under-bump through the first hole;
a second dielectric layer that covers the first dielectric layer and the second bump part of the under-bump; and
a metal oxide layer between the second bump part and the second dielectric layer; and
a void region between the second bump part and the metal oxide layer,
wherein an inner sidewall of the first hole makes a first angle with the bottom surface of the first dielectric layer, and
wherein the first angle is an acute angle that ranges from about 45° to less than 90°.

11. The semiconductor package of claim 10, wherein the first redistribution substrate further includes:
a wetting layer between the external connection terminal and the under-bump; and
a first barrier/seed layer between the under-bump and the first dielectric layer and between the under-bump and the wetting layer.

12. The semiconductor package of claim 10, wherein a sidewall of the first bump part makes a second angle with a bottom surface of the second bump part,
wherein the second angle ranges from about 90° to about 135°.

13. The semiconductor package of claim 11, wherein a sidewall of the external connection terminal, a sidewall of the wetting layer, and a sidewall of the first barrier/seed layer are aligned with each other.

14. A semiconductor package, comprising:
a first redistribution substrate;
a first semiconductor device on the first redistribution substrate; and
a mold layer that covers the first semiconductor device and the first redistribution substrate,
wherein the first redistribution substrate includes
a first dielectric layer that includes a first hole;
an under-bump that includes a first bump part in the first hole and a second bump part that protrudes from the first bump part onto the first dielectric layer;

an external connection terminal on a bottom surface of the first dielectric layer and connected to the under-bump through the first hole;

a wetting layer between the external connection terminal and the under-bump;

a first barrier/seed layer on a top surface of the first dielectric layer, between the under-bump and the first dielectric layer, and between the under-bump and the wetting layer, the top and bottom surfaces being opposite surfaces of the first dielectric layer;

a second dielectric layer that covers the under-bump and the first dielectric layer; and a first redistribution pattern that penetrates the second dielectric layer and is connected to the under-bump, wherein the external connection terminal includes a first terminal part in the first hole; and a second terminal part that protrudes outwardly from the bottom surface of the first dielectric layer, wherein a sidewall of the first terminal part makes a first angle with a top surface of the second terminal part, and wherein the first angle is an acute angle that ranges from about 45° to less than 90°, wherein the second dielectric layer covers the second bump part of the under-bump, and wherein the first redistribution substrate further includes a metal oxide layer between the second bump part and the second dielectric layer; and a void region between the second bump part and the metal oxide layer.

15. The semiconductor package of claim 14, wherein a sidewall of the first bump part makes a second angle with a bottom surface of the second bump part, wherein the second angle ranges from about 90° to about 135°.

16. The semiconductor package of claim 14, wherein a sidewall of the external connection terminal, a sidewall of the wetting layer, and a sidewall of the first barrier/seed layer are aligned with each other.

* * * * *